(12) United States Patent
Hong

(10) Patent No.: US 9,147,721 B2
(45) Date of Patent: Sep. 29, 2015

(54) ORGANIC LIGHT EMITTING DISPLAY APPARATUSES AND METHODS OF MANUFACTURING ORGANIC LIGHT EMITTING DISPLAY APPARATUSES

(71) Applicant: Samsung Display Co., Ltd., Yongin, Gyeonggi-do (KR)

(72) Inventor: Sang-Min Hong, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/298,087

(22) Filed: Jun. 6, 2014

(65) Prior Publication Data
US 2015/0115234 A1    Apr. 30, 2015

(30) Foreign Application Priority Data

Oct. 29, 2013    (KR) .......................... 10-2013-0129306

(51) Int. Cl.
*H01L 27/32* (2006.01)
*H01L 51/52* (2006.01)
*H01L 51/56* (2006.01)

(52) U.S. Cl.
CPC .......... *H01L 27/3276* (2013.01); *H01L 51/525* (2013.01); *H01L 51/5246* (2013.01); *H01L 51/5253* (2013.01); *H01L 51/56* (2013.01)

(58) Field of Classification Search
None
See application file for complete search history.

(56) References Cited

U.S. PATENT DOCUMENTS

| 2007/0170850 A1* | 7/2007 | Choi et al. ..................... 313/506 |
| 2011/0043495 A1* | 2/2011 | Bang et al. ..................... 345/204 |
| 2011/0134094 A1 | 6/2011 | Nathan et al. |
| 2011/0221720 A1 | 9/2011 | Kuo et al. |
| 2012/0080664 A1 | 4/2012 | Kim et al. |
| 2014/0374759 A1* | 12/2014 | Kim et al. ........................ 257/59 |

FOREIGN PATENT DOCUMENTS

| KR | 10-2008-0023498 | 3/2008 |
| KR | 10-2012-0035040 | 4/2012 |
| KR | 10-2013-0015113 | 2/2013 |
| KR | 10-2013-0046913 | 5/2013 |

OTHER PUBLICATIONS

'Solutions for OLEDs' downloaded from URL < http://www.saesgetters.com/sites/default/files/Solutions%20for%20OLEDs_0.pdf> on Feb. 13, 2015.*

(Continued)

*Primary Examiner* — Joseph Schoenholtz
(74) *Attorney, Agent, or Firm* — Knobbe Martens Olson & Bear LLP

(57) ABSTRACT

An organic light emitting display apparatus includes a first substrate, a second substrate, an organic light emitting device, a thin film transistor, a wiring pattern and a seal. The first substrate includes a first region, a second region and a third region. The third region surrounds the first region. The second region is between the first region and the third region, and is partially overlapped with the third region. The second substrate faces the first substrate. The organic light emitting device is disposed on the first substrate in the first region. The thin film transistor is disposed on the first substrate in a region where the second region and the third region overlap. The wiring pattern is disposed on the first substrate in the second region. The seal is disposed in the third region, between the first substrate and the second substrate in the third region.

21 Claims, 21 Drawing Sheets

(56) References Cited

OTHER PUBLICATIONS

Cho, Sung-Woo, et. al., "Highly Flexible, Transparent, and Low Resistance Indium Zinc Oxide—Ag—indium Zinc Oxide Multilayer Anode on Polyethylene Terephthalate Substrate for Flexible Organic Light Light-emitting Diodes." Thin Solid Films 516.21 (2008): 7881-885.*

* cited by examiner

SECOND DIRECTION

FIRST DIRECTION

ORGANIC LIGHT EMITTING DISPLAY APPARATUSES AND METHODS OF MANUFACTURING ORGANIC LIGHT EMITTING DISPLAY APPARATUSES

CROSS-REFERENCE TO RELATED APPLICATIONS

This application claims priority under 35 USC §119 to Korean Patent Application No. 10-2013-0129306 filed on Oct. 29, 2013 in the Korean Intellectual Property Office (KIPO), the disclosure of which is herein incorporated by reference in its entirety.

BACKGROUND

1. Field

Example embodiments relate to organic light emitting display apparatuses having reduced non-display regions, and methods of manufacturing the same.

2. Description of the Related Technology

An organic light emitting display (OLED) device displays information such as images and characters using light generated from an organic layer therein. In the organic light emitting display apparatus, light is generated by combination of holes from an anode and electrons from a cathode occurred at the organic layer between the anode and the cathode. In comparison to various display devices such as a liquid crystal display (LCD) device, a plasma display (PDP) device, and a field emission display (FED) device, the organic light emitting display device has several advantages such as wide viewing angle, high response time, thin thickness, and low power consumption, such that the organic light emitting display is widely employed in various electrical and electronic apparatuses.

The OLED device is divided into a display region and a non-display region. The non-display region typically includes a first region for receiving a peripheral circuit to control organic light emitting structures, and a second region for receiving a seal to encapsulate the organic light emitting structures. Research has been conducted to reduce the non-display region.

SUMMARY OF CERTAIN INVENTIVE ASPECTS

Example embodiments provide an organic light emitting display apparatus having an improved encapsulation structure and a reduced non-display region.

Example embodiments provide a method of manufacturing an organic light emitting display apparatus having an improved encapsulation structure and a reduced non-display region.

According to one aspect of example embodiments, there is provided an organic light emitting display apparatus including a first substrate, a second substrate, an organic light emitting device, a thin film transistor, a wiring pattern and a seal. The first substrate includes a first region, a second region and a third region. The third region surrounds the first region. The second region is between the first region and the third region, and is partially overlapped with the third region. The second substrate faces the first substrate. The organic light emitting device is disposed on the first substrate in the first region. The thin film transistor is disposed on the first substrate in a region where the second region and the third region overlap. The wiring pattern is disposed on the first substrate in the second region. The seal is in the third region and is disposed between the first substrate and the second substrate.

In example embodiments, the organic light emitting device may include a first electrode, an organic light emitting structure and a second electrode.

In example embodiments, the second electrode may be disposed in the second region and the first region, and the second electrode may be exposed by the seal.

In example embodiments, the organic light emitting display apparatus may further include a conductive pattern disposed in the second region. The conductive pattern may electrically connect the wiring pattern and the second electrode. The conductive pattern may include a same material as the first electrode.

In example embodiments, the conductive pattern may be exposed by the seal.

In example embodiments, the second electrode may include an alloy of magnesium (Mg) and silver (Ag).

In example embodiments, the first electrode may have a multi layered structure including an indium tin oxide (ITO)/Ag/ITO stack.

In example embodiments, the wiring pattern may be disposed adjacent to the first region.

In example embodiments, the wiring pattern may have a multi layered structure including a Ti/Al/Ti stack.

In example embodiments, the seal may overlap the thin film transistor, and the wiring pattern is exposed by the seal.

In example embodiments, the wiring pattern may be configured to transfer a power supply voltage.

In example embodiments, the organic light emitting display apparatus may further include a second wiring pattern electrically connected to the wiring pattern. The second wiring pattern may include a same material as a gate electrode of the thin film transistor.

In example embodiments, the organic light emitting display apparatus may further include an insulating interlayer covering the wiring pattern. The insulating interlayer may be configured to protect the wiring pattern from heat damage.

According to one aspect of example embodiments, there is provided an organic light emitting display apparatus including a first substrate, a second substrate, a first thin film transistor, an organic light emitting device, a second thin film transistor, an insulation layer, a wiring pattern and a seal. The first substrate includes a first region, a second region and a third region. The third region surrounds the first region. The second region is between the first region and the third region, and is partially overlapped with the third region. The second substrate is opposed to the first substrate. The first thin film transistor is disposed on the first substrate in the first region. The organic light emitting device is disposed on the first substrate in the first region. The organic light emitting device is electrically connected to the first thin film transistor. The second thin film transistor is disposed on the first substrate in a region where the second region and the third region overlap. The insulation layer covers the first thin film transistor. The insulation layer includes an organic insulation material. The wiring pattern is disposed on the first substrate in the second region. The wiring pattern overlaps the second thin film transistor. The seal is disposed between the first substrate and the second substrate in the third region.

In example embodiments, the insulation layer may be disposed on the first substrate in the first region, and the second region, and the insulation layer may be exposed by the seal.

In example embodiments, the organic light emitting display apparatus may further include an insulating interlayer between the insulation layer and the first substrate. The insulating interlayer may cover the second thin film transistor, and the wiring pattern may be disposed on the insulating interlayer.

In example embodiments, the organic light emitting device may include a first electrode, an organic light emitting structure and a second electrode. The second electrode may be exposed by the seal.

According to one aspect of example embodiments, there is provided a method of manufacturing an organic light emitting display apparatus. In the method, a first substrate is prepared to include a first region, a second region and a third region. The third region surrounds the first region. The second region is between the first region and the third region, and is partially overlapped with the third region. A first thin film transistor is formed on the first substrate in the first region. A second thin film transistor is formed on the first substrate in a region where the second region and the third region overlap. An organic light emitting device is formed on the first substrate in the first region. A second substrate is arranged to face the first substrate. A seal is formed between the first substrate and the second substrate in the third region. A laser beam is irradiated to melt the seal.

In example embodiments, forming the organic light emitting device may include forming a first electrode electrically connected to the first thin film transistor, forming an organic light emitting structure on the first substrate and forming a second electrode on the organic light emitting structure. The second electrode may be exposed by the seal.

In example embodiments, a wiring pattern may be formed in the second region after forming the first thin film transistor and the second thin film transistor.

In example embodiments, conductive pattern may be formed in the second region. The conductive pattern may be electrically connected to the wiring pattern. Forming the conductive pattern and forming the first electrode may be performed simultaneously.

In example embodiments, the conductive pattern may be electrically connected to the second electrode, and the conductive pattern may be exposed by the seal.

BRIEF DESCRIPTION OF THE DRAWINGS

Example embodiments can be understood in more detail from the following description taken in conjunction with the accompanying drawings, in which.

DETAILED DESCRIPTION OF CERTAIN INVENTIVE EMBODIMENTS

Figure 1:
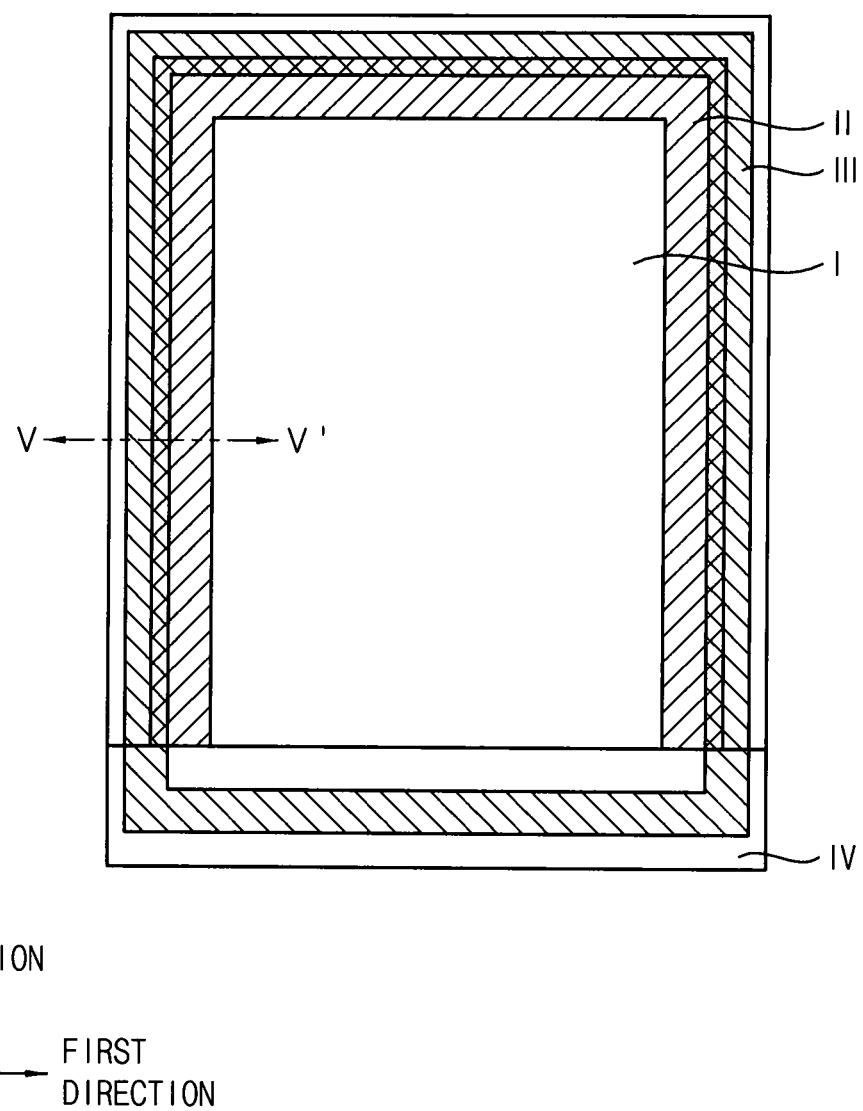
FIG. 1 is a plan view illustrating an organic light emitting display apparatus in accordance with some example embodiments.

The example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals generally refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
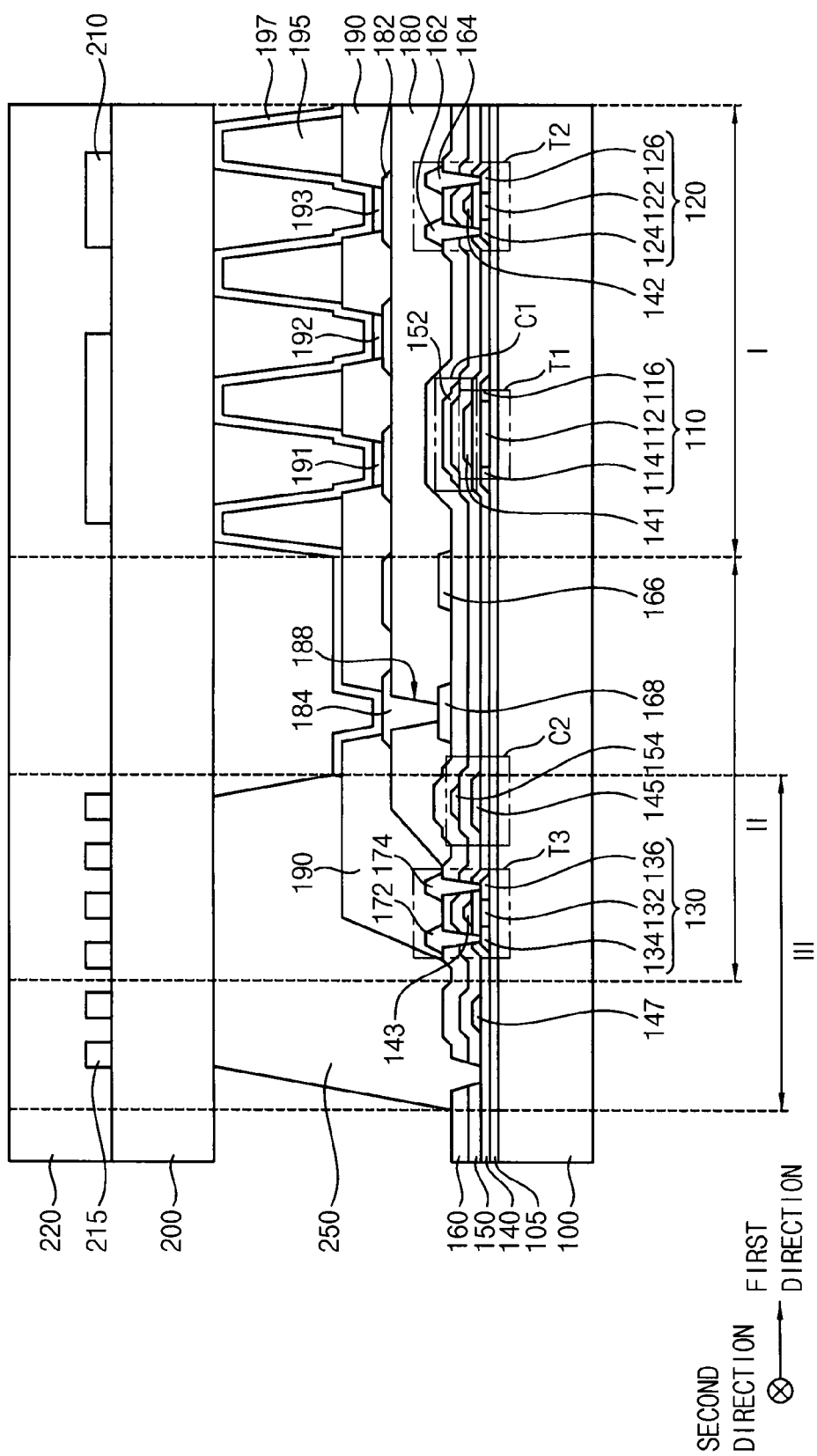
FIG. 2 is a cross sectional view partially illustrating an organic light emitting display apparatus in accordance with some example embodiments.

FIG. 1 is a plan view illustrating an organic light emitting display apparatus in accordance with some example embodiments, and FIG. 2 is a cross sectional view cut along line V-V' of FIG. 2.

Referring to FIG. 1, the organic light emitting display apparatus in accordance with some example embodiments may be divided into a first region (I), a second region (II), a third region (III) and a fourth region (IV) which may be sequentially disposed from a center to an edge of the organic light emitting display apparatus.

In example embodiments, the first region (I) may be a display region in which a plurality of pixels may be disposed. The first region (I) may be disposed at a center of the organic light emitting display apparatus, and may have a relatively large area. Each of the pixels may include an organic light emitting display device including a first electrode, a second electrode and an organic light emitting display structure. When the organic light emitting display apparatus is an active type, each of the pixels may further include a pixel circuit having a thin film transistor electrically connected to the organic light emitting display structure. The detailed structures of the pixels are described with reference to FIG. 2 as follows.

The third region (III) may be a cell-sealing region in which a seal may be disposed to encapsulate the organic light emitting device and the pixel circuit. The third region (III) may entirely surround the first region (I). The third region (III) may be spaced apart from the first region (I) by a predetermined distance. The third region (III) may form a closed loop that surrounds four sides of the first region (I).

The second region (II) may be a circuit region in which a peripheral circuit and a wiring may be disposed to provide the organic light emitting device with an electrical signal and a power. The second region (II) may be disposed between the first region (I) and the third region (III). In example embodiments, the second region (II) may surround at least three sides of the first region (I). The second region (II) may directly contact the sides of the first region (I), however the second region (II) may not overlap the first region (I). The second region (II) may partially overlap the third region (III). Therefore, a non-display region including the second region (II) and the third region (III) may have a reduced area.

The fourth region (IV) may be a peripheral region in which a plurality of pads may be disposed to receive a driving power and a driving signal from external parts or an IC chip including a data driving portion. In example embodiments, the fourth region (IV) may be disposed at one side of the first to third regions (I, II and III). For example, the fourth region (IV) may be disposed at a bottom side of the first region (I).

Referring to FIG. 2, the organic light emitting display apparatus may include a first substrate 100 and a second substrate 200 which may face each other. The organic light emitting display apparatus may further include a plurality of thin film transistor (TFT)s T1, T2 and T3, capacitors C1 and C2, wiring patterns 168 and 215, an organic light emitting device and a seal 250 which may be disposed between the first substrate 100 and the second substrate 200.

The organic light emitting device and the pixel circuit including the first thin film transistor T1, the second thin film transistor T2 and the first capacitor C1 may be disposed in the first region (I), the peripheral circuits including the third thin film transistor T3, the second capacitor C2 and the first wiring pattern 168 may be disposed in the second region (II), and the seal 250 and the second wiring pattern 215 may be disposed in the third region (III).

The first substrate 100 may include a transparent insulation substrate. For example, the first substrate 100 may include a glass substrate, a quartz substrate, a transparent resin substrate, or the like. Alternatively, the first substrate 100 may include a flexible substrate.

A buffer layer 105 may be disposed on the substrate 100. The buffer layer 105 may provide a flat top surface, and may prevent impurities from diffusing into the first substrate 100.

A first active pattern 110, a second active pattern 120 and a third active pattern 130 may be disposed on the buffer layer 105. In example embodiments, the first to third active patterns 110, 120 and 130 may include polysilicon, doped polysilicon, amorphous silicon, doped amorphous silicon, and the like. These may be used alone or in a combination thereof. In other example embodiments, the first to third active patterns 110, 120 and 130 may include an oxide semiconductor such as, for example, aluminum zinc oxide (AlZnO), aluminum zinc tin oxide (AlZnSnO), gallium zinc tin oxide (GaZnSnO), indium gallium oxide (InGaO), indium gallium zinc oxide (InGaZnO), indium tin zinc oxide (InSnZnO), indium zinc oxide (InZnO), hafnium indium zinc oxide (HfInZnO) and zirconium tin oxide (ZnSnO), or the like.

The first to third active patterns 110, 120 and 130 may include channel regions 112, 122 and 132, source regions 114, 124 and 134 and drain regions 116, 126 and 136, respectively. In example embodiments, the first and second active patterns 110 and 120 may be disposed in the first region (I) and the third active pattern 130 may be disposed in a region where the second region (II) and the third region (III) overlap.

A gate insulation layer 140 may be disposed on the buffer layer 105 to cover the first to third active patterns 110, 120 and 130. In example embodiments, the gate insulation layer 140 may include, for example, silicon oxide, silicon nitride or an inorganic insulation material having a high dielectric permittivity.

A first gate electrode 141, a second gate electrode 142 and a third gate electrode 143 may be disposed on the gate insulation layer 140 to overlap the first to third active patterns 110, 120 and 130, respectively. Further, a first conductive pattern 145 may be disposed on the gate insulation layer 140 in the region where the second region (II) and the third region (III) overlap, and a reflective pattern 147 may be disposed on the gate insulation layer 140 in the third region III.

The first to third gate electrodes 141, 142 and 143, the first conductive pattern 145 and the reflective pattern 147 may include a polysilicon, a metal or an alloy such as, for example, aluminum (Al), magnesium (Mg), silver (Ag), platinum (Pt), gold (Au), chromium (Cr), tungsten (W), molybdenum (Mo), titanium (Ti), palladium (Pd)) and/or alloys of these metals. For example, when the first to third gate electrodes 141, 142 and 143, the first conductive pattern 145 and the reflective pattern 147 include molybdenum (Mo), the first to third gate electrodes 141, 142 and 143 and the first conductive pattern 145 may have a relatively small electrical resistance, and the reflective pattern 147 may have a relatively large reflectivity about a laser beam.

The first insulating interlayer 150 may be disposed on the gate insulation layer 140 to cover the gate electrodes 141, 142 and 143, the first conductive pattern 145 and the reflective pattern 147.

Further, a second conductive pattern 152 and a third conductive pattern 154 may be disposed on the first insulating interlayer 150. In example embodiments, the second conductive pattern 152 may be disposed to overlap the first gate electrode 141, and the third conductive pattern 154 may be disposed to overlap the first conductive pattern 145. Therefore, the second conductive pattern 152, the first gate electrode 141 and a portion of the first insulating interlayer 150 therebetween may constitute the first capacitor C1. The third conductive pattern 154, the first conductive pattern 145 and a portion of the first insulating interlayer 150 therebetween may constitute the second capacitor C2.

In example embodiments, the second conductive pattern 152 and the third conductive pattern 154 may include a material substantially the same as that of the first conductive pattern 145.

The second insulating interlayer 160 may be disposed on the first insulating interlayer 150 to cover the second conductive pattern 152 and the third conductive pattern 154.

Referring still to FIG. 2, source electrodes 162 and 172 and drain electrodes 164 and 174 may be disposed on the second insulating interlayer 160 to penetrate the insulating interlayers 150 and 160 and the gate insulation layer 140. The source electrodes 162 and 172, and the drain electrodes 164 and 174 may contact the source regions 124 and 134 and the drain regions 126 and 136, respectively.

Therefore, the first active pattern 110 including the first channel region 112, the first source region 114 and the first drain region 116, the gate insulation layer 140, the first gate electrode 141, a source electrode and a drain electrode may constitute the first thin film transistor T1. Further, the second active pattern 120 including the second channel region 122, the second source region 124 and the second drain region 126, the gate insulation layer 140, the second gate electrode 142, the first source electrode 162 and the first drain electrode 164 may constitute the second thin film transistor T2. The third active pattern 130 including the third channel region 132, the third source region 134 and the third drain region 136, the gate insulation layer 140, the third gate electrode 143, the second source electrode 172 and the second drain 174 electrode may constitute the third thin film transistor T3.

The third thin film transistor T3 and the second capacitor C2 may constitute the peripheral circuit for providing the organic light emitting device with an electrical signal and a power. In example embodiments, the third thin film transistor T3 and the second capacitor C2 may be disposed in the region where the second region (II) and the third region (III) overlap.

Further, a fourth conductive pattern 166 and the first wiring pattern 168 may be disposed on the second insulating interlayer 160 in the second region (II). Particularly, the first wiring pattern 168 may be disposed in the second region (II) where the third region (III) does not overlap. In example embodiments, the first wiring pattern 168 may serve as a power supply wiring for transferring a power supply voltage (such as, for example, ELVSS), and the first wiring pattern 168 may extend in a second direction parallel to a top surface of the first substrate 100.

In example embodiments, the source electrodes 162 and 172, the drain electrodes 164 and 174, the fourth conductive pattern 166 and the first wiring pattern 168 may have a single layered structure or a multi layered structure. For example, the source electrodes 162 and 172, the drain electrodes 164 and 174, the fourth conductive pattern 166 and the first wiring pattern 168 may include a multi layered structure including, for example, a titanium (Ti) layer, an aluminum (Al) layer and a titanium (Ti) layer which may be stacked sequentially. The multi layered structure may have a relatively small electrical resistance due at least in part to the aluminum layer, and the multi layered structure may have an improved contact characteristic due at least in part to the titanium layers.

The thin film transistors T1, T2 and T3 illustrated in FIG. 2 may have a top gate structure in which the gate electrodes 141, 142 and 143 are disposed above the active patterns 110, 120 and 130, however the present invention is not limited thereto. For example, the thin film transistors may have a bottom gate structure in which the active patterns are disposed above the gate electrodes.

The insulation layer 180 may be disposed on the second insulating interlayer 160 to cover the first source electrode 162, the first drain electrode 164, the fourth conductive pattern 166 and the first wiring pattern 168. In example embodiments, the insulation layer 180 may extend from the first region (I) to the second region (II) and the third region (III). However, the insulation layer 180 may expose or partially expose the second source electrode 172 and the second drain electrode 174 disposed in the third region (III). For example, the insulation layer 180 may include an insulation organic material such as, for example, polyimide.

Referring still to FIG. 2, the first electrode 182, a fifth conductive pattern 184 and a pixel defining layer 190 may be disposed on the insulation layer 180.

The first electrode 182 may be disposed on the insulation layer 180 in the first region (I). The first electrode 182 may be coupled to the drain electrode of the first thin film transistor T1 by a contact penetrating the insulation layer 180. The first electrode 182 may be electrically connected to the first thin film transistor T1.

In example embodiments, the first electrode 182 may serve as a pixel electrode that may be patterned to correspond to each pixel. Further, the first electrode 182 may be an anode for supplying holes into organic light emitting structures 191, 192 and 193.

When the organic light emitting display apparatus is a top emission type, the first electrode 182 may serve as a reflective electrode having reflectivity. Therefore, the first electrode 182 may include a metal and/or an alloy having a relatively high reflectivity. The material of the first electrode 182 may be changed depending on the emission type of the organic light emitting display apparatus.

The fifth conductive pattern 184 may be disposed on the insulation layer 180 in the second region (II), and may not be disposed in the third region (III). The fifth conductive pattern 184 may be electrically connected to the first wiring pattern 168 by a contact hole 188 penetrating the insulation layer 180.

The first electrode 182 and the fifth conductive pattern 184 may have a single layered structure or a multi-layered structure. In example embodiments, the first electrode 182 and the fifth conductive pattern 184 may have a multi layered structure including a metal layer and a transparent conductive oxide layer. For example, the first electrode 182 and the fifth conductive pattern 184 may have a multi layered structure including an ITO/Ag/ITO stack. Therefore, the first electrode 182 and the fifth conductive pattern 184 may have a relatively small electrical resistance.

The pixel defining layer 190 may be disposed in the first to third regions (I, II and III) to cover the insulation layer 180, the fifth conductive pattern 184, the second source electrode 172 and the second drain electrode 174. The pixel defining layer 190 may separate each of the pixels in the first region (I). The pixel defining layer 190 may cover the fifth conductive pattern 184 in the second region (II) and the third region (III), such that the pixel defining layer 190 may isolate and protect the fifth conductive pattern 184, the second source electrode 172 and the second drain electrode 174.

The organic light emitting structures 191, 192 and 193 may be disposed on the first electrode 182 in the first region (I). The organic light emitting structures 191, 192 and 193 may include at least one organic light emitting layer. In some example embodiments, each of the organic light emitting structures 191, 192, 193 may include each of a blue light emitting layer, a green light emitting layer or a red light emitting layer, respectively. In other example embodiments, the organic light emitting structures 191, 192 and 193 may include a blue light emitting layer, a green light emitting layer and a red light emitting layer that may be sequentially stacked to emit a white light. Further, the organic light emitting structures 191, 192 and 193 may selectively include a hole transfer layer, a hole injection layer, an electron injection layer or an electrode transfer layer.

A spacer 195 may be disposed on the pixel defining layer 190 in the first region (I). The spacer 195 may determine and maintain a distance between the first substrate 100 and the second substrate 200.

The second electrode 197 may be disposed on the pixel defining layer 190, the organic light emitting structures 191, 192 and 193 and the fifth conductive pattern 184 in the first region (I) and the second region (II). The second electrode 197 may not be disposed in the third region (III). Therefore, the first electrode 182, the organic light emitting structures 191, 192 and 193, and the second electrode 197 may constitute the organic light emitting device in the first region (I). Further, the second electrode 197 may be electrically connected to the fifth conductive pattern 184 in the second region (II). The second electrode 197 may be electrically connected to the first wiring pattern 168 by the fifth conductive pattern 184, such that the first wiring pattern 168 may apply a power supply voltage (such as, for example, ELVSS) to the second electrode 197.

In example embodiments, the second electrode 197 may include a metal and/or an alloy such as, for example, silver (Ag), aluminum (Al), platinum (Pt), gold (Au), chrome (Cr), tungsten (W), molybdenum (Mo), titanium (Ti), palladium (Pa), alloys of these metals, and the like. For example, the second electrode 197 may include an alloy of silver (Ag) and magnesium (Mg), so that the second electrode 197 may have a relatively small electrical resistance and a relatively large light transmittance.

The second substrate 200 may be opposed to the first substrate 100. The second substrate 200 may include a material substantially the same as or similar to that of the first substrate 100. In example embodiments, the second substrate 200 may serve as an encapsulation substrate to cover the organic light emitting device on the first substrate 100.

The seal 250 may be disposed between the first substrate 100 and the second substrate 200 in the third region (III). The seal 250 may be a closed loop to encapsulate the organic light emitting device in the first region (I). In example embodiments, the seal 250 may be melted by a laser beam and may be solidified to complete a gap between the first substrate 100 and the second substrate 200.

The seal 250 may be disposed in an entire area of the third region (III), so that the seal 250 may overlap the third thin film transistor T3 and the second capacitor C2 disposed in a region where the second region (II) and the third region (III) overlap. The second region (II) may partially overlap the third region (III), so that the non-display region including the second region (II) and the third region (III) may have a reduced area.

Further, the seal 250 may not overlap the second electrode 197, the first wiring pattern 168 and the fifth conductive pattern 184 disposed in the second region (II). Therefore, a laser beam used to heat the seal 250 may not damage the second electrode 197, the first wiring pattern 168 and the fifth conductive pattern 184.

Referring still to FIG. 2, a plurality of sensing cells 210, a plurality of second wiring patterns 215 and a protection layer 220 may be disposed on the second substrate 200.

In example embodiments, the plurality of sensing cells 210 may be disposed in the first region (I), and the plurality of second wiring patterns 215 may be disposed in the third region (III). For example, the second wiring patterns 215 may include a metal such as, for example, molybdenum (Mo).

The protection layer 220 covering the plurality of sensing cells 210 and the plurality of second wiring patterns 215 may include, for example, silicon oxide or silicon nitride.

Figure 3:
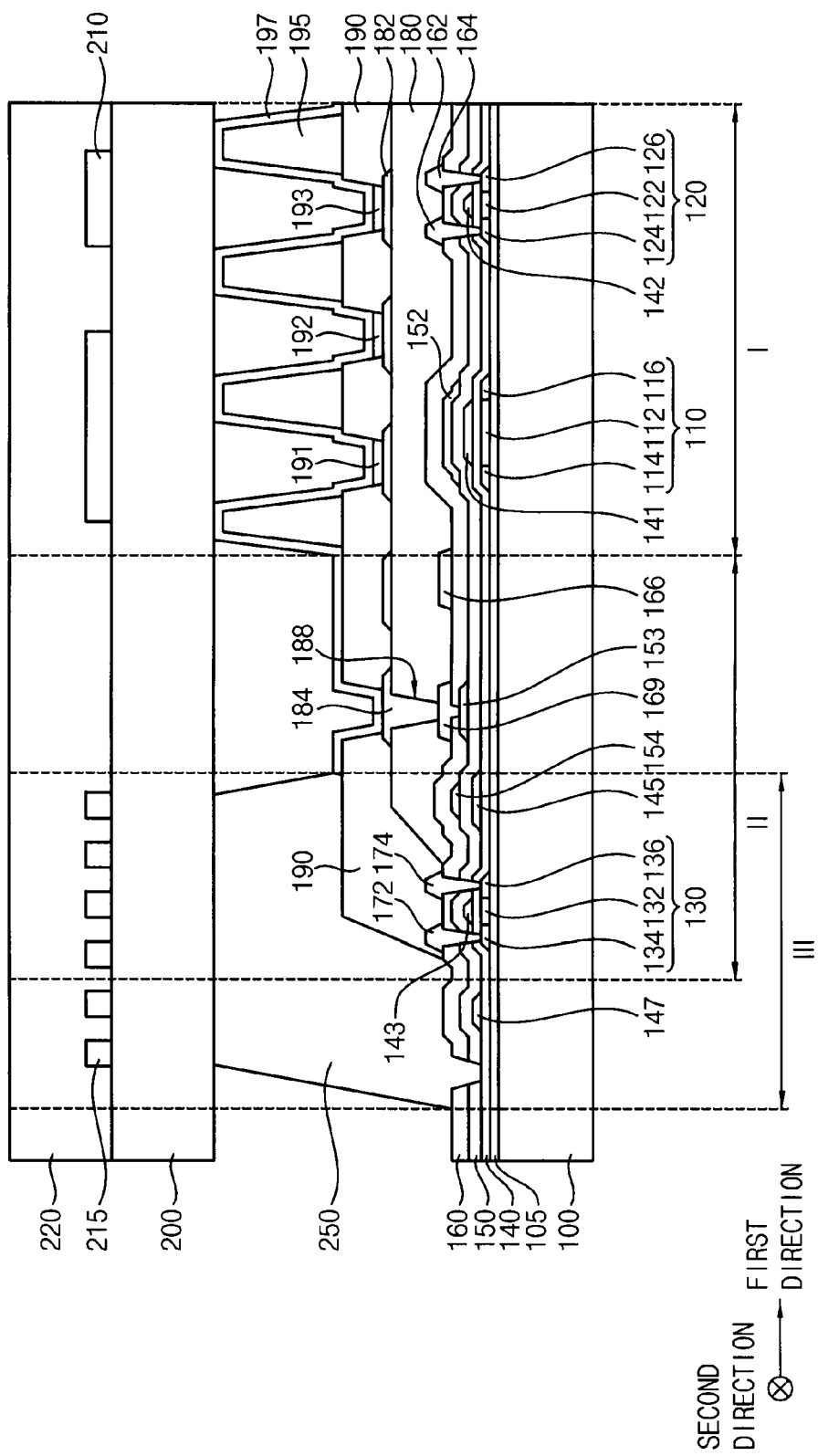
FIG. 3 is a cross sectional view partially illustrating an organic light emitting display apparatus in accordance with some example embodiments.

FIG. 3 is a cross sectional view partially illustrating an organic light emitting display apparatus in accordance with some example embodiments. The organic light emitting display apparatus of FIG. 3 may be substantially the same as or similar to the organic light emitting display apparatus of FIGS. 1 and 2 except for the first wiring pattern 169 and the third wiring pattern 153.

Referring to FIG. 3, the organic light emitting display apparatus may include a first substrate 100 and a second substrate 200 which may face each other. The organic light emitting display apparatus may further include a plurality of thin film transistors, capacitors, wiring patterns 169, 153 and 215, an organic light emitting device and a seal 250 which may be disposed between the first substrate 100 and the second substrate 200. Further, the organic light emitting display apparatus may include a first region (I), a second region (II) and a third region (III).

The organic light emitting device and the pixel circuit including first and second thin film transistors and a first capacitor may be disposed in the first region (I), the peripheral circuits including a third thin film transistor, a second capacitor, the first wiring pattern 169 and the third wiring pattern 153 may be disposed in the second region (II), and the seal 250 and the second wiring pattern 215 may be disposed in the third region (III).

The third wiring pattern 153 may be disposed on a first insulating interlayer 150 in the second region (II). Particularly, the third wiring pattern 153 may be disposed in the second region (II), and may not be disposed in the third region (III). In example embodiments, the third wiring pattern 153 may serve as a power supply wiring for transferring a power supply voltage (such as, for example, ELVSS) to the organic light emitting device.

The first wiring pattern 169 may be disposed on a second insulating interlayer 160 in the second region (II). The first wiring pattern 169 may be electrically connected to the third wiring pattern 153 by a contact hole penetrating the second insulating interlayer 160. The first wiring pattern 169 may also serve as a power supply wiring for transferring a power supply voltage (such as, for example, ELVSS) to the organic light emitting device. The power supply wiring may have an enlarged cross-sectional area, so that a voltage drop in the power supply wiring may be reduced.

Further, the fifth conductive pattern 184 may be disposed on an insulation layer 180 in the second region (II), and may not be disposed in the third region (III). The fifth conductive pattern 184 may electrically connect the second electrode 197 and the first wiring pattern 169. Therefore, the power supply voltage (such as, for example, ELVSS) may be applied to the second electrode 197.

The seal 250 may be disposed between the first substrate 100 and the second substrate 200 in the third region (III). The seal 250 encapsulating the organic light emitting device in the first region (I) may overlap the peripheral circuit including the thin film transistor and the second capacitor disposed in a region where the second region (II) and the third region (III) overlap. Therefore, the non-display region including the second region (II) and the third region (III) may have a reduced area.

According to example embodiments, the organic light emitting display apparatus may include a second electrode 197, the first wiring pattern 169, the third wiring pattern 153 and the fifth conductive pattern 184 which may be disposed in the second region (II). The seal 250 may not overlap the second electrode 197, the first wiring pattern 169, the third wiring pattern 153 and the fifth conductive pattern 184, so that a laser beam used to heat the seal 250 may not damage the second electrode 197, the first wiring pattern 169, the third wiring pattern 153 and the fifth conductive pattern 184.

Figure 4:
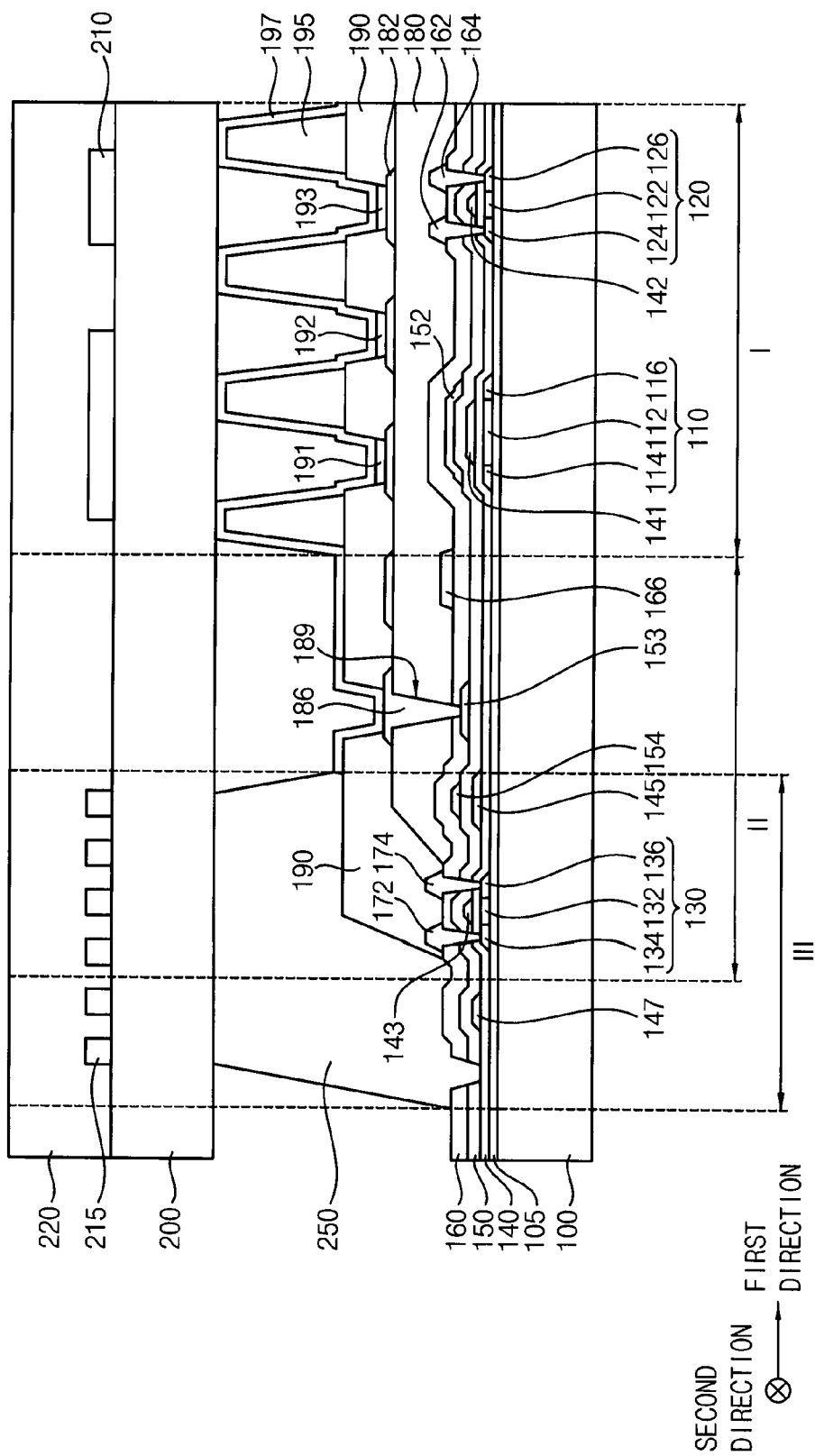
FIG. 4 is a cross sectional view partially illustrating an organic light emitting display apparatus in accordance with some example embodiments.

FIG. 4 is a cross sectional view partially illustrating an organic light emitting display apparatus in accordance with some example embodiments. The organic light emitting display apparatus of FIG. 4 may be substantially the same as or similar to the organic light emitting display apparatus of FIGS. 1 and 2 except for the first wiring pattern and the third wiring pattern 153.

Referring to FIG. 4, the organic light emitting display apparatus may include a first substrate 100 and a second substrate 200 which may face each other. The organic light emitting display apparatus may further include a plurality of thin film transistors, capacitors, wiring patterns 153 and 215, an organic light emitting device and a seal 250 which may be disposed between the first substrate 100 and the second substrate 200. Further, the organic light emitting display apparatus may include a first region (I), a second region (II) and a third region (III).

The organic light emitting device and the pixel circuit including first and second thin film transistors and a first capacitor may be disposed in the first region (I), the peripheral circuits including a third thin film transistor, a second capacitor and the third wiring pattern 153 may be disposed in the second region (II), and the seal 250 and the second wiring pattern 215 may be disposed in the third region (III).

The third wiring pattern 153 may be disposed on a first insulating interlayer 150 in the second region (II). Particularly, the third wiring pattern 153 may be disposed in the second region (II), and may not be disposed in the third region (III). In example embodiments, the third wiring pattern 153 may serve as a power supply wiring for transferring a power supply voltage (such as, for example, ELVSS) to the organic light emitting device. The third wiring pattern 153 may extend in a second direction. Further, the third wiring pattern 153 may be electrically connected to a wiring pattern (not shown) which is disposed on the second insulation layer 160.

Further, the fifth conductive pattern 184 may be disposed on an insulation layer 180 in the second region (II), and may not be disposed in the third region (III). The fifth conductive pattern 184 may electrically connect the second electrode 197 and the third wiring pattern 153. That is, the fifth conductive pattern 184 may be electrically connected to the third wiring pattern 153 by a contact hole penetrating the insulation layer 180 and the second insulating interlayer 160. Therefore, the power supply voltage (such as, for example, ELVSS) may be applied to the second electrode 197.

According to example embodiments, the organic light emitting display apparatus may include a second electrode 197, the third wiring pattern 153 and the fifth conductive pattern 184 which may be disposed in the second region (II). The seal 250 may not overlap the second electrode 197, the third wiring pattern 153 and the fifth conductive pattern 184, so that a laser beam used to heat the seal 250 may not damage the second electrode 197, the third wiring pattern 153 and the fifth conductive pattern 184.

Figure 5:
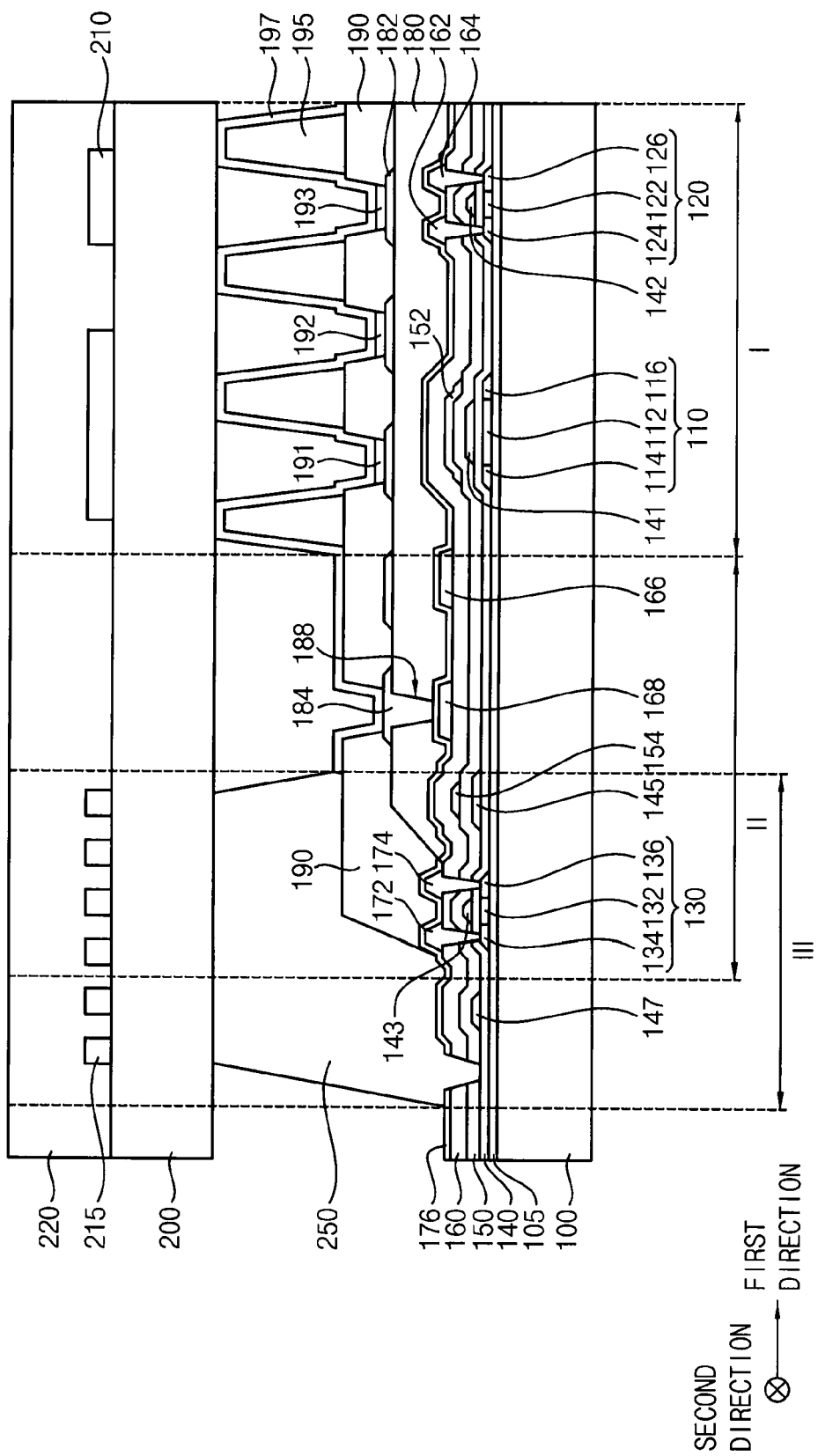
FIG. 5 is a cross sectional view partially illustrating an organic light emitting display apparatus in accordance with some example embodiments.

FIG. 5 is a cross sectional view partially illustrating an organic light emitting display apparatus in accordance with some example embodiments. The organic light emitting display apparatus of FIG. 5 may be substantially the same as or similar to the organic light emitting display apparatus of FIGS. 1 and 2 except for a third insulating interlayer 176.

Referring to FIG. 5, the organic light emitting display apparatus may include a first substrate 100 and a second substrate 200 which may face each other. The organic light emitting display apparatus may further include a plurality of thin film transistors, capacitors, wiring patterns 168 and 215, an organic light emitting device and a seal 250 which may be disposed between the first substrate 100 and the second substrate 200. Further, the organic light emitting display apparatus may include a first region (I), a second region (II) and a third region (III).

The organic light emitting device and the pixel circuit including first and second thin film transistors and a first capacitor may be disposed in the first region (I), the peripheral circuits including a third thin film transistor, a second capacitor and the first wiring pattern 168 may be disposed in the second region (II), and the seal 250 and the second wiring patterns 215 may be disposed in the third region (III).

The first wiring pattern 168 may be disposed on a first insulating interlayer 160 in the second region (II). Particularly, the first wiring pattern 168 may serve as a power supply wiring for transferring a power supply voltage (such as, for example, ELVSS) to the organic light emitting device.

The third insulating interlayer 176 may be disposed on the second insulating interlayer 160 to cover source electrode 162 and 172, drain electrodes 164 and 174, the fourth conductive pattern 166 and the first wiring pattern 168. In example embodiments, the third insulating interlayer 176 may include, for example, silicon oxide or silicon nitride. Therefore, the third insulating interlayer 176 may serve to protect the first wiring pattern 168 from heat damage.

According to example embodiments, the organic light emitting display apparatus may include a second electrode 197, the first wiring pattern 168 and the fifth conductive pattern 184 which may be disposed in the second region (II) and may be exposed by a seal 250. Therefore, a laser beam used to heat the seal 250 may not damage the second electrode 197, the first wiring pattern 168 and the fifth conductive pattern 184. Further, the third insulating interlayer 176 covering the first wiring pattern 168 may serve as a heat blocker.

Figure 6:
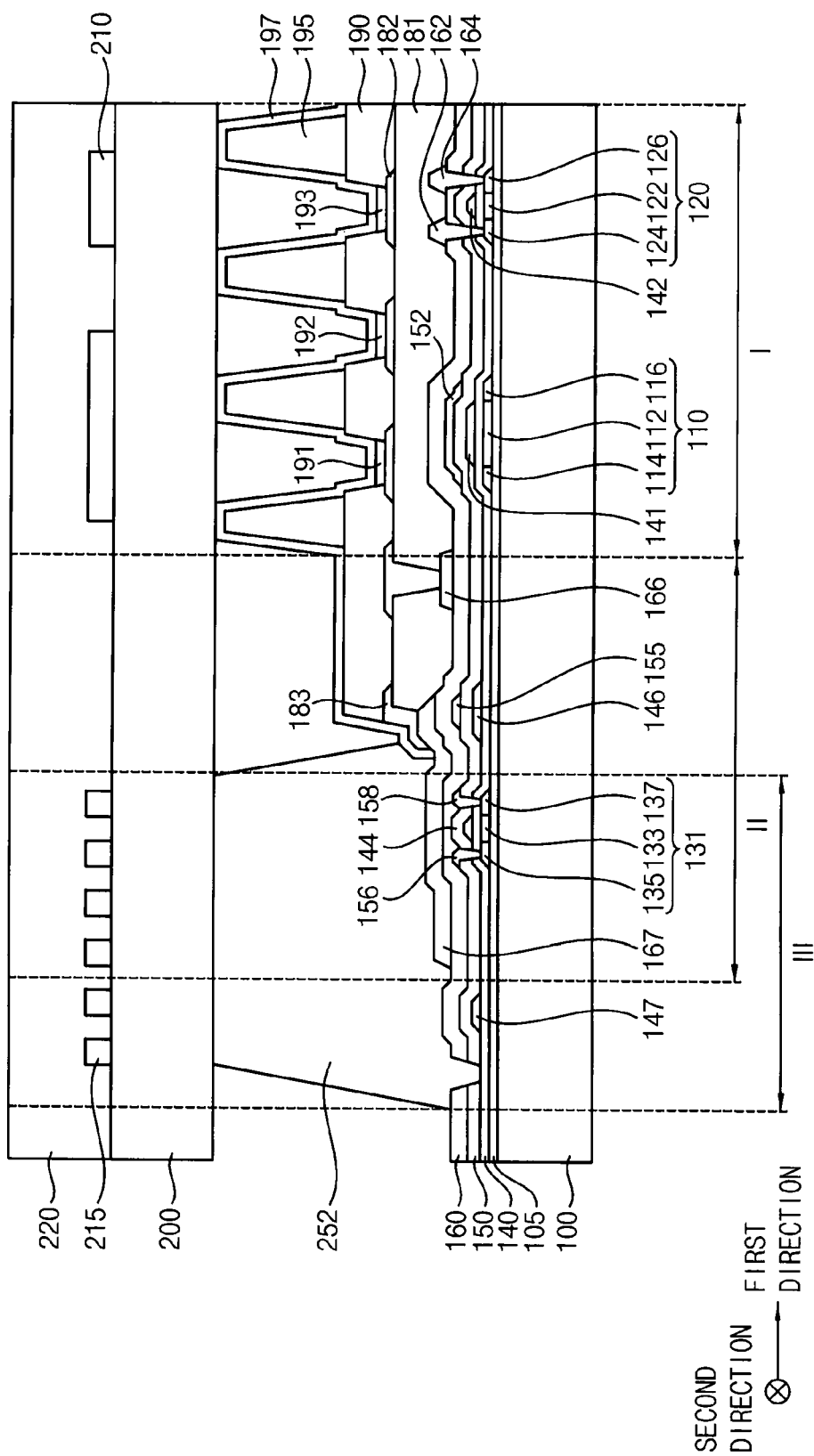
FIG. 6 is a cross sectional view partially illustrating an organic light emitting display apparatus in accordance with some example embodiments.

FIG. 6 is a cross sectional view partially illustrating an organic light emitting display apparatus in accordance with some example embodiments.

Referring to FIG. 6, the organic light emitting display apparatus may include a first substrate 100 and a second substrate 200 which may face each other. The organic light emitting display apparatus may further include a plurality of thin film transistors, capacitors, wiring patterns 146, 147, 167 and 215, an organic light emitting device and a seal 250 which may be disposed between the first substrate 100 and the second substrate 200. Further, the organic light emitting display apparatus may include a first region (I), a second region (II) and a third region (III).

The organic light emitting device and the pixel circuit including first and second thin film transistors and a first capacitor may be disposed in the first region (I). The organic light emitting device and the pixel circuit may be substantially the same as those of FIGS. 1 and 2.

On the other hand, a peripheral circuit including a third thin film transistor, a second capacitor, the first wiring pattern 167 and the fifth conductive pattern 183 may be disposed in the second region (II), and a seal 252 and a second wiring pattern 215 may be disposed in the third region (III).

The third thin film transistor may be disposed in a region where the second region (II) and the third region (III) may overlap. The third transistor may include a third active pattern 131, a gate insulation layer 140, a third gate electrode 144, a second source electrode 156 and a second drain electrode 158.

In example embodiments, the third active pattern 131 may be disposed on a buffer layer 105, and may include a third channel region 133, a third source region 135 and a third drain region 137.

The third gate electrode 144 may be disposed on the gate insulation layer 140 to overlap the third channel region 133. The third gate electrode 144 may be covered by a first insulating interlayer 150.

The second source electrode 156 and the second drain electrode 158 on the first insulating interlayer 150 may be electrically connected to the third source region 135 and the third drain region 137 by a contact penetrating the first insulating interlayer 150 and the gate insulation layer 140, respectively. In example embodiments, the second source electrode 156 and the second drain electrode 158 may be formed during a process for forming a second conductive pattern 152 and a third conductive pattern 155.

A second insulating interlayer 160 may be formed on the first insulating interlayer 150 to cover the second source electrode 156, the second drain electrode 158, the second conductive pattern 152 and the third conductive pattern 155.

The first wiring pattern 167 may be disposed on the second insulating interlayer 160 in the second region (II) and the third region (III). The first wiring pattern 167 may be formed during a process for forming a first source electrode 162 and a first drain electrode 164. The first wiring pattern 167 may be formed to overlap the third thin film transistor. However, the second source electrode 156 and the second drain electrode 158 may be formed under the second insulating interlayer 160, and the first wiring pattern 167 may be disposed on the second insulating interlayer 160, so that the first wiring pattern 167 may be electrically isolated from the third thin film transistor.

Referring still to FIG. 6, an insulation layer 181 may be disposed in the first region (I) and the second region (II). However, the insulation layer 181 may not be disposed in the third region (III). The insulation layer 181 may include an insulation organic material such as, for example, polyimide.

The fifth conductive pattern 183 may be disposed on a top surface and a sidewall of the insulation layer 181, such that the fifth conductive pattern 183 may be electrically connected to the first wiring pattern 167. Further, the fifth conductive pattern 183 may be disposed in the second region (II), not in the third region (III).

According to example embodiments, the insulation layer 181 including the insulation organic material may not be disposed in the third region (III). Therefore, the insulation layer 181 may not be deformed by a laser beam for heating the seal. Further, the fifth conductive pattern 183 and the second electrode 197 may not be disposed in the third region (III), the fifth conductive pattern 183 and the second electrode 197 may not be damaged by the laser beam. The first wiring pattern 167 overlapping the third thin film transistor may prevent a thermal damage of the third thin film transistor from the laser beam.

FIGS. 7 to 15 are cross sectional views illustrating a method of manufacturing an organic light emitting display apparatus in accordance with some example embodiments.

Figure 7:
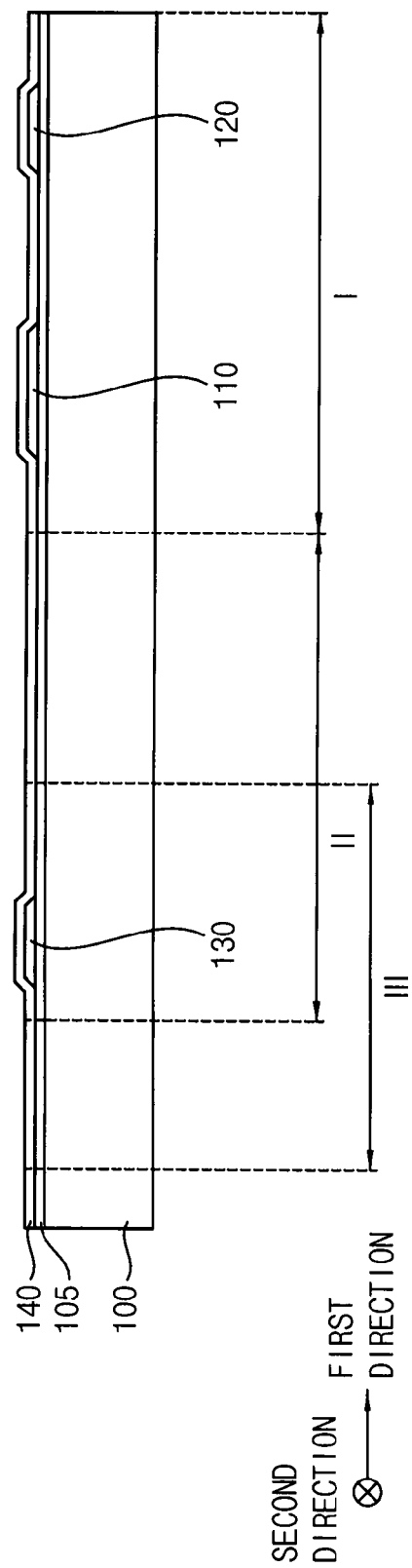
FIGS. 7 to 15 are cross sectional views illustrating a method of manufacturing an organic light emitting display apparatus in accordance with some example embodiments.

Referring to FIG. 7, a buffer layer 105, active patterns 110, 120 and 130 and a gate insulation layer 130 may be formed on a first substrate 100.

The first substrate 100 may include a first region (I), a second region (II) and a third region (III) as illustrated in FIG. 1. Further, the third region (III) may surround the first region (I). The second region (II) may be disposed between the first region (I) and the third region (III), and the second region (II) may be partially overlapped with the third region (III).

Firstly, the buffer layer 105 and a semiconductor layer may be sequentially formed on the first substrate 100, and then the semiconductor layer may be patterned to form the active patterns 110, 120 and 130. In example embodiments, the first active pattern 110 and the second active pattern 120 may be formed in the first region (I), and the third active pattern 130 may be disposed in a region where the second region (II) and the third region (III) overlap.

In example embodiments, the semiconductor layer may include, for example, polysilicon, doped polysilicon, amorphous silicon, doped amorphous silicon, and the like. These may be used alone or in a combination thereof. In other example embodiments, the semiconductor layer may include an oxide semiconductor such as, for example, aluminum zinc oxide (AlZnO), aluminum zinc tin oxide (AlZnSnO), gallium zinc tin oxide (GaZnSnO), indium gallium oxide (InGaO), indium gallium zinc oxide (InGaZnO), indium tin zinc oxide (InSnZnO), indium zinc oxide (InZnO), hafnium indium zinc oxide (HfInZnO) and zirconium tin oxide (ZnSnO), or the like.

Then, the gate insulation layer 140 may be formed on the buffer layer 105 to cover the active patterns 110, 120 and 130. In example embodiments, the gate insulation layer 140 may be formed by, for example, a chemical vapor deposition (CVD) process using, for example, silicon oxide, silicon nitride or an inorganic insulation material having a high dielectric permittivity.

Figure 8:
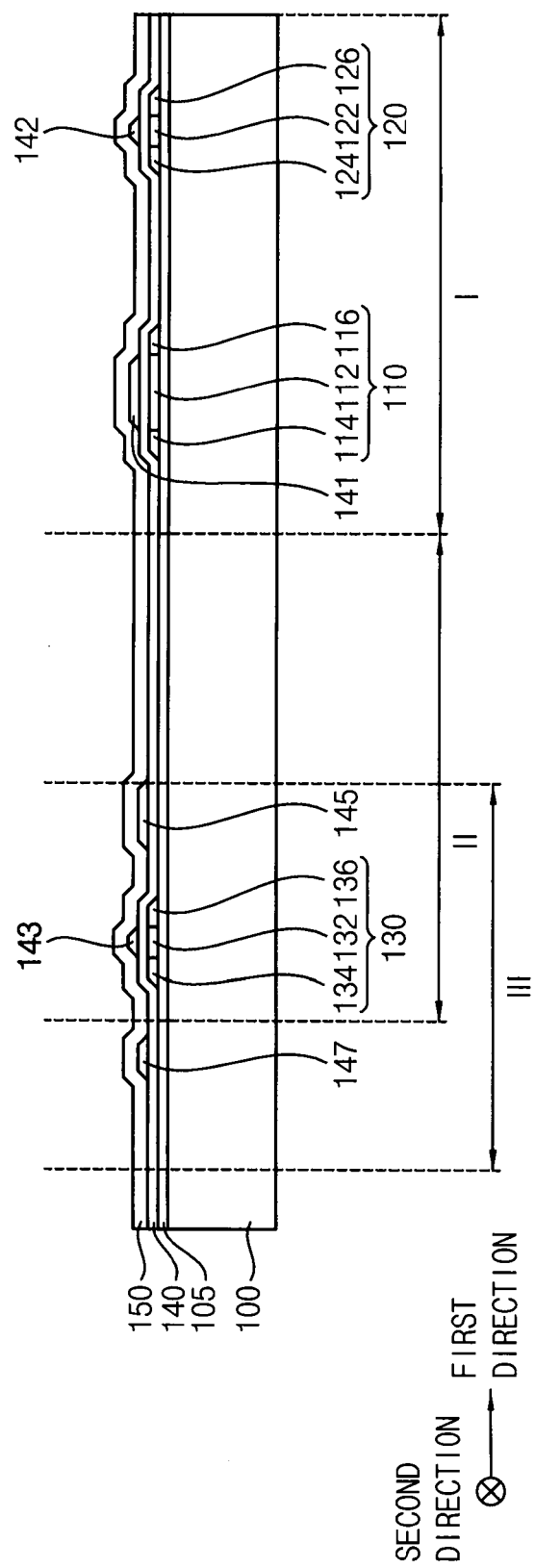

Referring to FIG. 8, gate electrodes 141, 142 and 143, a first conductive pattern 145 and a reflective pattern 147 may be formed on the gate insulation layer 140, and then a first insulating interlayer 150 may be formed on the gate insulation layer 140.

A first conductive layer may be formed on the gate insulation layer 140 by a sputtering process, and then the first conductive layer may be patterned to form the gate electrodes 141, 142 and 143, the first conductive pattern 145 and the reflective pattern 147 may be formed on the gate insulation layer 140. Then, the first insulating interlayer 150 may be formed to cover the gate electrodes 141, 142 and 143, the first conductive pattern 145 and the reflective pattern 147 by a CVD process using, for example, silicon oxide or silicon nitride.

In example embodiments, the first conductive layer may include a polysilicon, a metal or an alloy such as, for example, aluminum (Al), magnesium (Mg), silver (Ag), platinum (Pt), gold (Au), chromium (Cr), tungsten (W), molybdenum (Mo), titanium (Ti), palladium (Pd) and/or alloys of these metals.

For example, when the first conductive layer includes molybdenum (Mo), the first to third gate electrodes 141, 142 and 143 and the first conductive pattern 145 may have a relatively small electrical resistance, and the reflective pattern 147 may have a relatively large reflectivity about a laser beam.

The first gate electrode 141, the second gate electrode 142 and the third gate electrode 143 may be disposed on the gate insulation layer 140 to overlap the first to third active patterns 110, 120 and 130, respectively. The first conductive pattern 145 may be disposed adjacent to the third gate electrode 143. The first conductive pattern 145 may be disposed in the region where the second region (II) and the third region (III) overlap. Further, the reflective pattern 147 may be disposed in the third region (III).

An impurity doping process may be performed to form impurity regions in the active patterns 110, 120 and 130. The impurity doping process may be performed using the gate electrodes 141, 142 and 143 as an ion implantation mask. Therefore, the first active pattern 110 may include the first channel region 112, the first source region 114 and the first drain region 116. The second active pattern 120 may include the second channel region 122, the second source region 124 and the second drain region 126, and the third active pattern 130 may include the third channel region 132, the third source region 134 and the third drain region 136.

Figure 9:
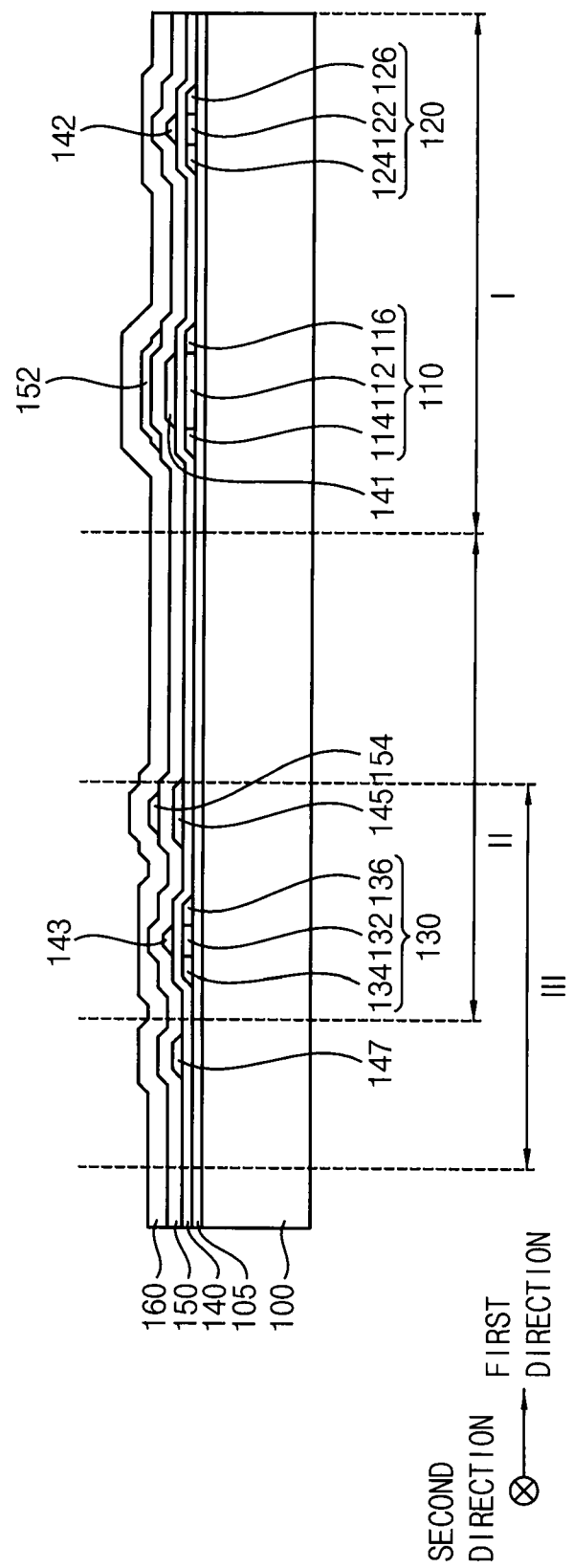

Referring to FIG. 9, a second conductive pattern 152 and a third conductive pattern 154 may be formed on the first insulating interlayer 150, and a second insulating interlayer 160 may be formed on the first insulating interlayer 150.

A second conductive layer may be formed on the first insulating interlayer 150 by a sputtering process, and then the second conductive layer may be patterned to form the second conductive pattern 152 and the third conductive pattern 154. For example, the second conductive layer may be formed using a material substantially the same as that of the first conductive layer. Then, the second insulating interlayer 160 may be formed to cover the second conductive pattern 152 and the third conductive pattern 154 by a CVD process using, for example, silicon oxide or silicon nitride.

The second conductive pattern 152 may be formed to overlap the first gate electrode 141, and the third conductive pattern 154 may be formed to overlap the first conductive pattern 145. Therefore, the second conductive pattern 152, the first gate electrode 141 and a portion of the first insulating interlayer 150 therebetween may constitute a first capacitor. The third conductive pattern 154, the first conductive pattern 145 and a portion of the first insulating interlayer 150 therebetween may constitute a second capacitor. The first gate electrode 141 may serve as not only a gate electrode of the first thin film transistor, but also an electrode of the first capacitor.

Figure 10:
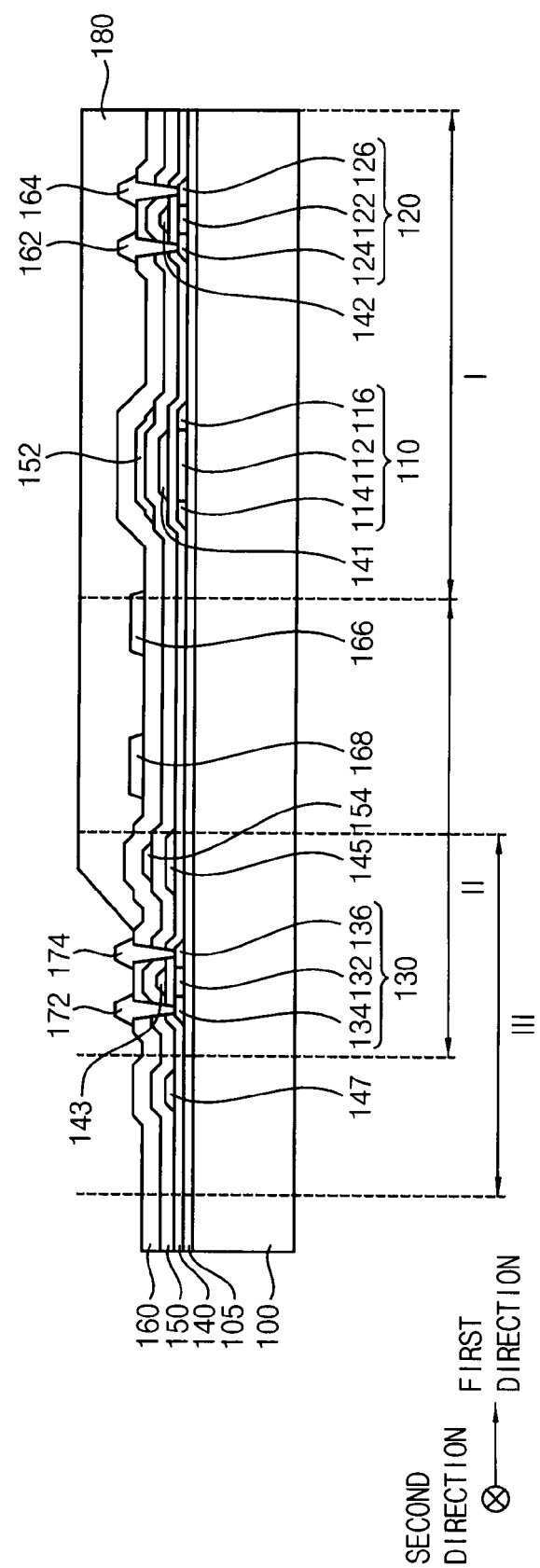

Referring to FIG. 10, source electrodes 162 and 172, drain electrodes 164 and 174, a fourth conductive pattern 166 and a first wiring pattern 168 may be formed on the second insulating interlayer 160.

The gate insulation layer 140 and the insulating interlayers 150 and 160 may be partially removed to form openings exposing the source regions 124 and 134 and the drain regions 126 and 136, and a third conductive layer may be formed on the second insulating interlayer 160 to fill the openings. Then, the third conductive layer may be patterned to form the source electrodes 162 and 172, the drain electrodes 164 and 174, the fourth conductive pattern 166 and the first wiring pattern 168.

In example embodiments, the third conductive layer may have a single layered structure or a multi layered structure. For example, the third conductive layer may include a multi layered structure including, for example, a titanium (Ti) layer, an aluminum (Al) layer and a titanium (Ti) layer which may be stacked sequentially. The multi layered structure may have a relatively small electrical resistance due to the aluminum layer, and the multi layered structure may have an improved contact characteristic due to the titanium layers.

The source electrodes 162 and 172 and the drain electrodes 164 and 174 may contact the source regions 124 and 134 and the drain regions 126 and 136, respectively. Further, a source electrode (not shown) and a drain electrode (now shown) may be further formed to contact the first source region 114 and the first drain region 116. Therefore, the first active pattern 110 including the first channel region 112, the first source region 114 and the first drain region 116, the gate insulation layer 140, the first gate electrode 141, the source electrode (not shown) and the drain electrode (not shown) may constitute the first thin film transistor. Further, the second active pattern 120 including the second channel region 122, the second source region 124 and the second drain region 126, the gate insulation layer 140, the second gate electrode 142, the first source electrode 162 and the first drain electrode 164 may constitute the second thin film transistor. The third active pattern 130 including the third channel region 132, the third source region 134 and the third drain region 136, the gate insulation layer 140, the third gate electrode 143, the second source electrode 172 and the second drain 174 electrode may constitute the third thin film transistor.

In example embodiments, the first thin film transistor T1 may serve as a driving transistor for applying a voltage or a current to an organic light emitting device, and the second thin film transistor T2 may serve as a switching transistor for determining an operation of the organic light emitting device. In example embodiments, a plurality of first thin film transistors and a plurality of second thin film transistors may be disposed corresponding to a plurality of pixels.

The fourth conductive pattern 166 and the first wiring pattern 168 may be formed on the second insulating interlayer 160 in the second region (II). The first wiring pattern 168 may be disposed in the second region (II) where the third region (III) may not overlap. In example embodiments, the first wiring pattern 168 may serve as a power supply wiring for transferring a power supply voltage (such as, for example, ELVSS), and the first wiring pattern 168 may extend in a second direction parallel to a top surface of the first substrate 100.

Then, an insulation layer 180 may be formed to cover the first source electrode 162, the first drain electrode 164, the fourth conductive pattern 166 and the first wiring pattern 168. In example embodiments, the insulation layer 180 may have a flat top surface in the first region (I), and may partially cover the second region (II) and the third region (III). The insulation layer 180 may be formed using an insulation organic material such as, for example, polyimide.

Figure 11:
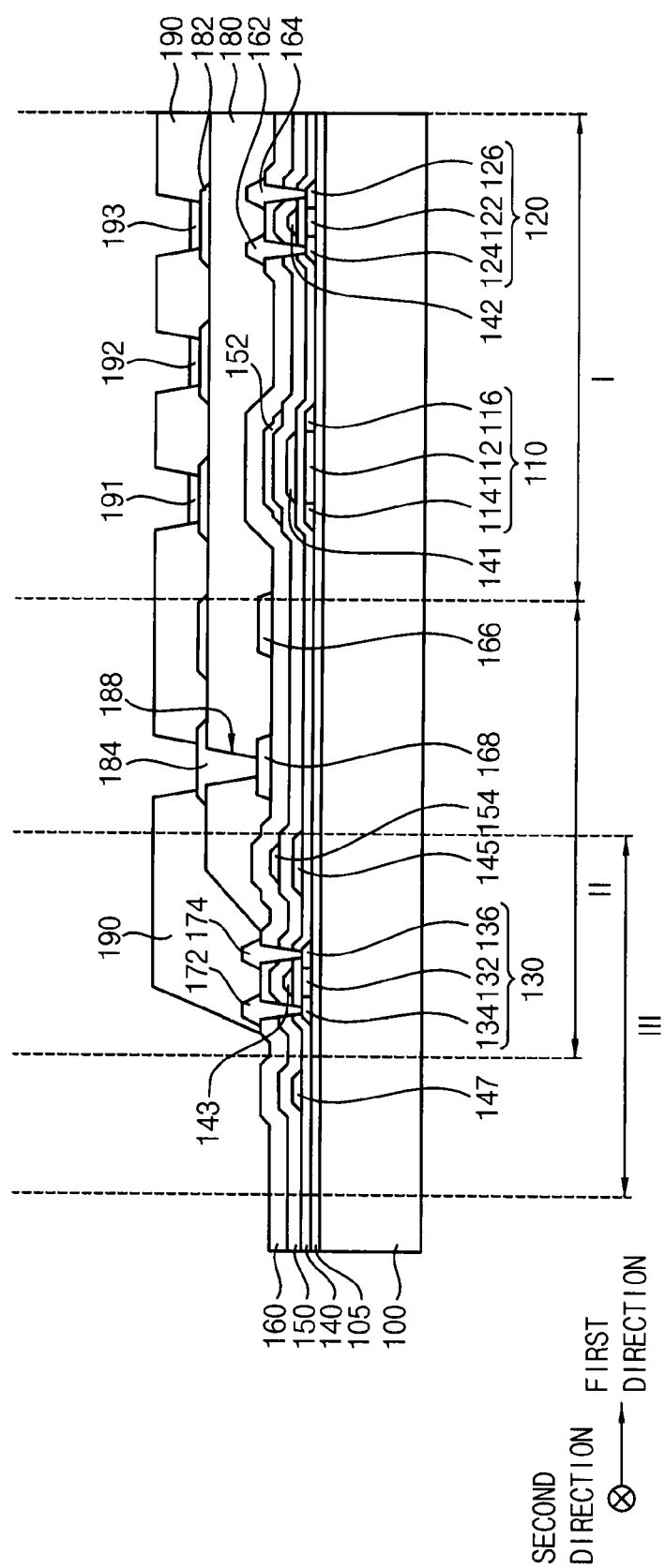

Referring to FIG. 11, a first electrode 182 and a fifth conductive pattern 184 may be formed on the insulation layer 180, and then a pixel defining layer 190 may be formed on the insulation layer 180.

The insulation layer 180 may be partially removed to form a contact hole 188 exposing the first wiring pattern 168, a fourth conductive layer may be formed on the insulation layer 180 to fill the contact hole 188, and then the fourth conductive layer may be patterned to form the first electrode 182 and the fifth conductive pattern 184.

The fourth conductive layer may have a single layered structure or a multi-layered structure. In example embodiments, the fourth conductive layer may have the multi layered structure including a metal layer and a transparent conductive oxide layer. For example, the fourth conductive layer may have the multi layered structure including an ITO/Ag/ITO stack. Therefore, the first electrode 182 and the fifth conductive pattern 184 may have a relative small electrical resistance.

A plurality of the first electrodes 182 may be formed in the first region (I). The fifth conductive pattern 184 may be disposed on the second region (II). The fifth conductive pattern 184 may not be formed in the third region (III), and may be electrically connected to the first wiring pattern 168 by the contact hole 188. Therefore, the fifth conductive pattern 184 may be formed adjacent to the first region (I) compared to the third thin film transistor.

The pixel defining layer 190 may be formed using an insulation material. In example embodiments, a plurality of the pixel defining layers 190 may be formed in the first region (I), the second region (II) and the third region (III). The pixel defining layer 190 may separate each of the pixels in the first region (I). The pixel defining layer 190 may cover the fifth conductive pattern 184 in the second region (II) and the third region (III), such that the pixel defining layer 190 may isolate and protect the fifth conductive pattern 184, the second source electrode 172 and the second drain electrode 174.

Figure 12:
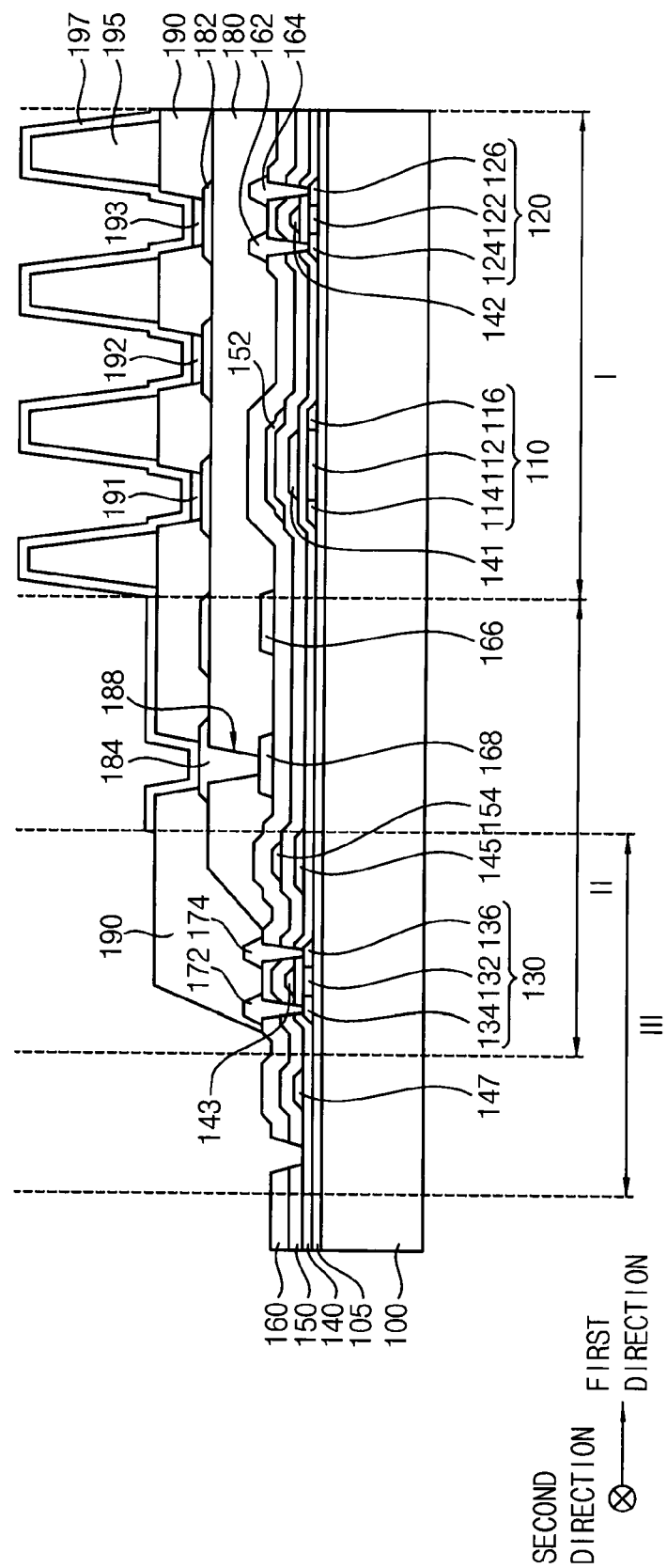

Referring to FIG. 12, organic light emitting structures 191, 192 and 193 may be formed on the first electrode 182, a spacer 195 may be formed on the pixel defining layer 190, and then a second electrode 197 may be formed to cover the spacer 195.

The organic light emitting structures 191, 192 and 193 may be formed to correspond to each pixel. The organic light emitting structures 191, 192 and 193 may include at least one organic light emitting layer, and may selectively include a hole transfer layer, a hole injection layer, an electron injection layer or an electrode transfer layer.

The second electrode 197 may be formed to cover the spacer 195, the pixel defining layer 190, the organic light emitting structures 191, 192 and 193 and the fifth conductive pattern 184. In example embodiments, the second electrode 197 may be formed in the first region (I) and the second region (II), and may not be formed in the third region (III). The second electrode 197 may include a metal and/or an alloy such as, for example, silver (Ag), aluminum (Al), platinum (Pt), gold (Au), chrome (Cr), tungsten (W), molybdenum (Mo), titanium (Ti), palladium (Pa), alloys of these metals, or the like. For example, the second electrode 197 may include an alloy of silver (Ag) and magnesium (Mg), so that the second electrode 197 may have a relatively small electrical resistance and a relatively large light transmittance.

Figure 13:
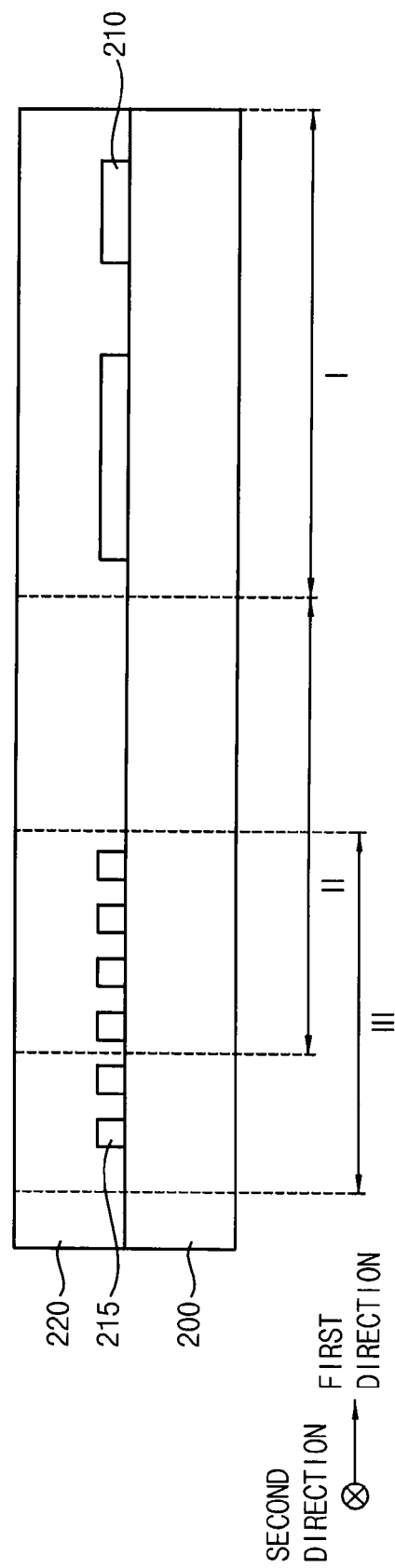

Referring to FIG. 13, a touch panel may be formed on a second substrate 200.

The second substrate 200 may also include the first region (I), the second region (II) and the third region (III) which may correspond to those of the first substrate 100.

The touch panel may include a plurality of sensing cells 210, a plurality of second wiring patterns 215 and a protection layer 220. In example embodiments, the plurality of sensing cells 210 may be disposed in the first region (I), and the plurality of second wiring patterns 215 may be disposed in the third region (III). The second wiring patterns 215 may include a metal such as, for example, molybdenum (Mo).

Figure 14:
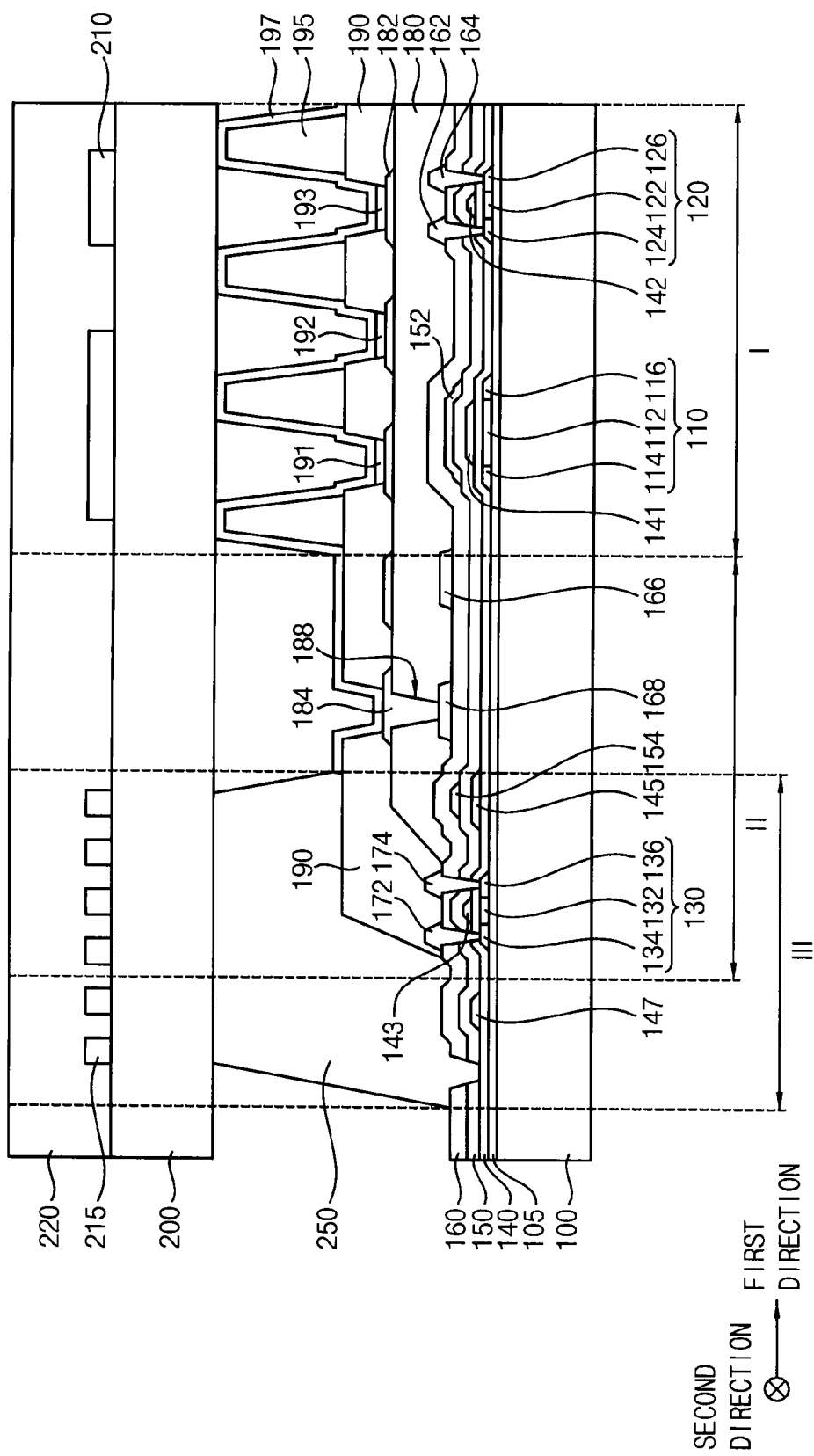

Referring to FIG. 14, the first substrate 100 and the second substrate 200 may be arranged to face each other, and a seal 250 may be disposed between the first substrate 100 and the second substrate 200 in the third region (III).

The spacer 195 of the first substrate 100 may directly contact a rear surface of the second substrate 200. A distance between the first substrate 100 and the second substrate 200 may be determined by a height of the spacer 195.

Further, before arranging the seal 250, the insulating interlayers 150 and 160 may be partially removed to form a plurality of openings.

Figure 15:
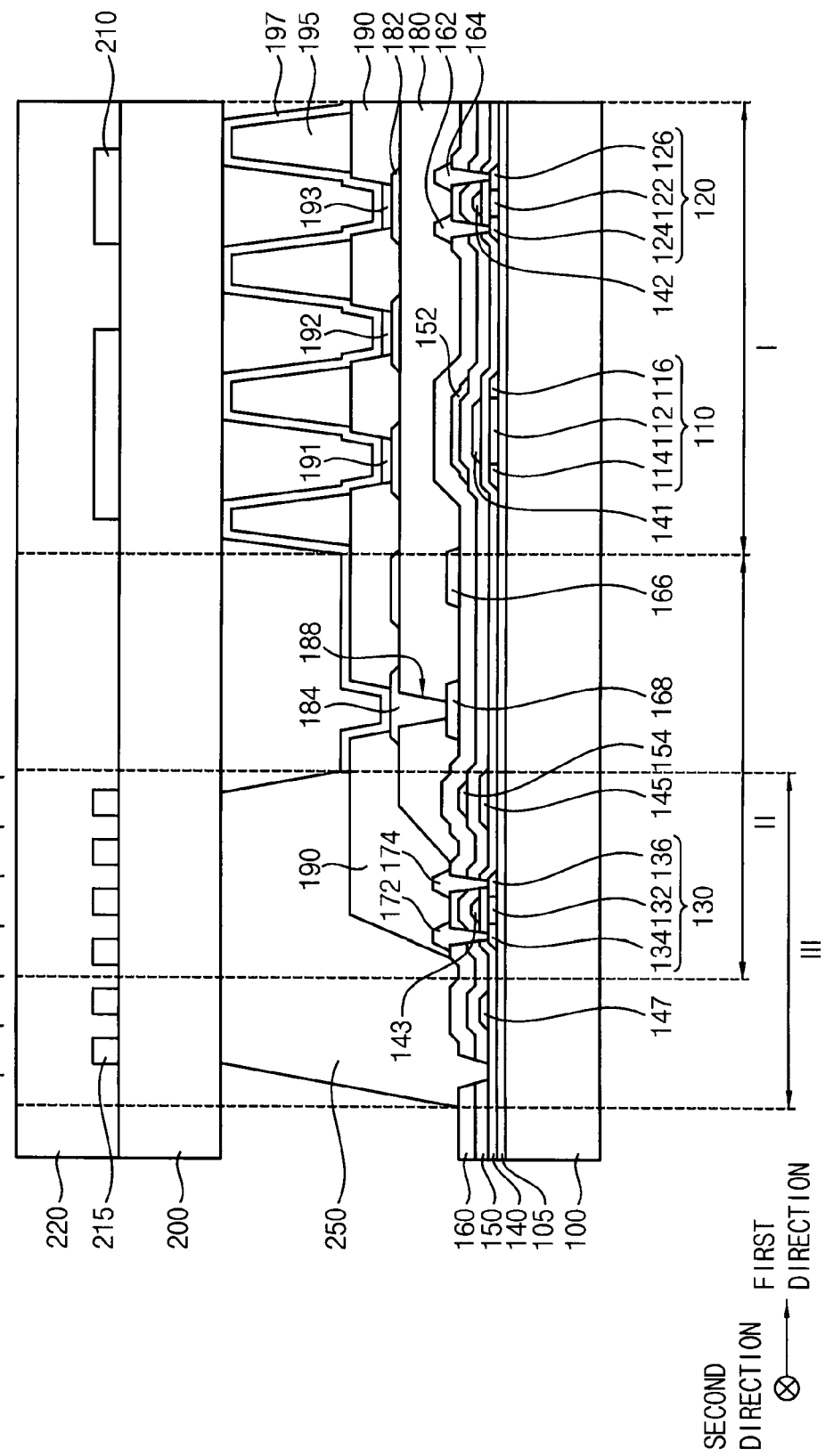

Referring to FIG. 15, a laser beam may be irradiated in the third region (III), so that the organic light emitting display apparatus may be encapsulated.

The seal 250 may be melted by the laser beam, so that the seal 250 may be deformed to complete a gap between the first substrate 100 and the second substrate 200.

The laser beam may be partially reflected by the second wiring pattern 215. Therefore, the strength of the laser beam may be adjusted enough to melt the seal 250. On the other hand, the laser beam may be reflected by the reflection pattern 147, so that the reflected laser beam may effectively melt a lower portion of the seal 250.

Further, the seal 250 may not overlap the second electrode 197, the first wiring pattern 168 and the fifth conductive pattern 184 disposed in the second region (II). Therefore, the laser beam used to heat the seal 250 may not damage the second electrode 197, the first wiring pattern 168 and the fifth conductive pattern 184.

FIGS. 16 to 21 are cross sectional views illustrating a method of manufacturing an organic light emitting display apparatus in accordance with some example embodiments. The method of manufacturing the organic light emitting display apparatus of FIGS. 16 to 21 may be substantially the same as similar to that of FIGS. 7 to 15.

Figure 16:
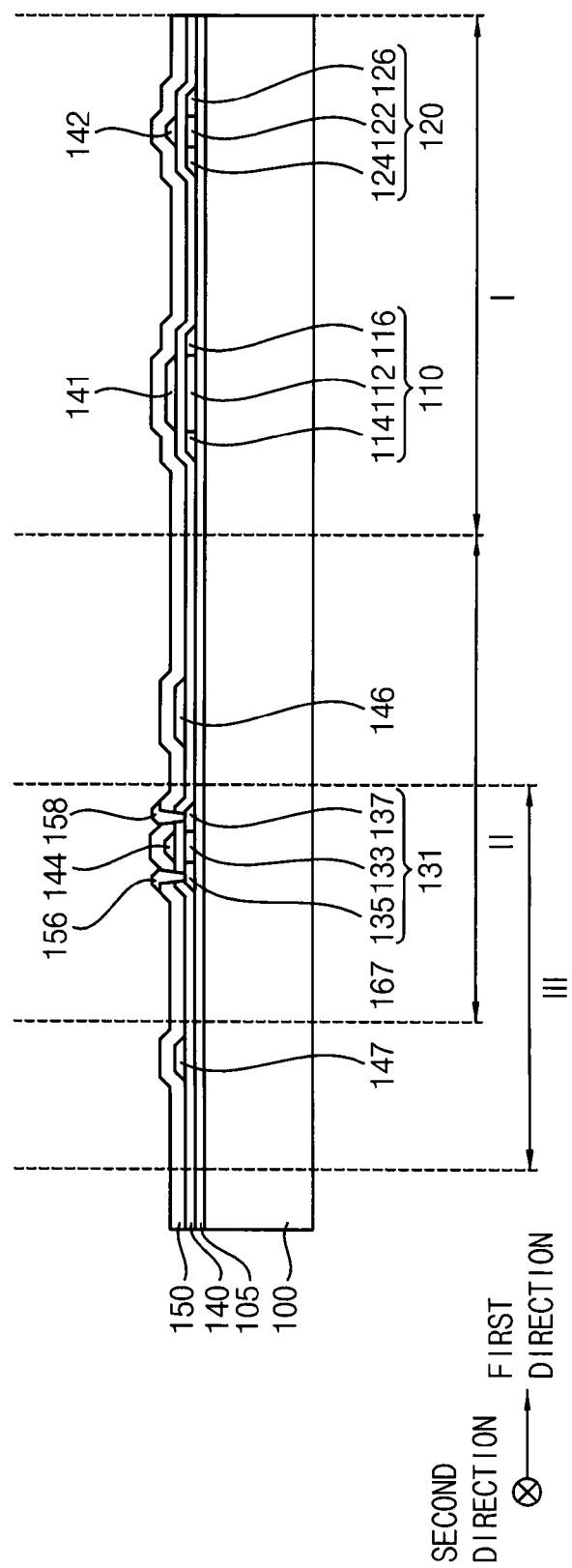
FIGS. 16 to 21 are cross sectional views illustrating a method of manufacturing an organic light emitting display apparatus in accordance with some example embodiments.

Referring to FIG. 16, processes described with reference to FIG. 7 and FIG. 8 may be performed. A buffer layer 105, active patterns 110, 120 and 130 and a gate insulation layer 130 may be formed on a first substrate 100. Gate electrodes 141, 142 and 143, a first conductive pattern 145 and a reflective pattern 147 may be formed on the gate insulation layer 140, and then a first insulating interlayer 150 may be formed on the gate insulation layer 140. Further, impurities may be doped into the active patterns 110, 120 and 130 thereby forming channel regions 112, 122 and 133, source regions 114, 124 and 135 and drain regions 116, 126 and 137.

Figure 17:
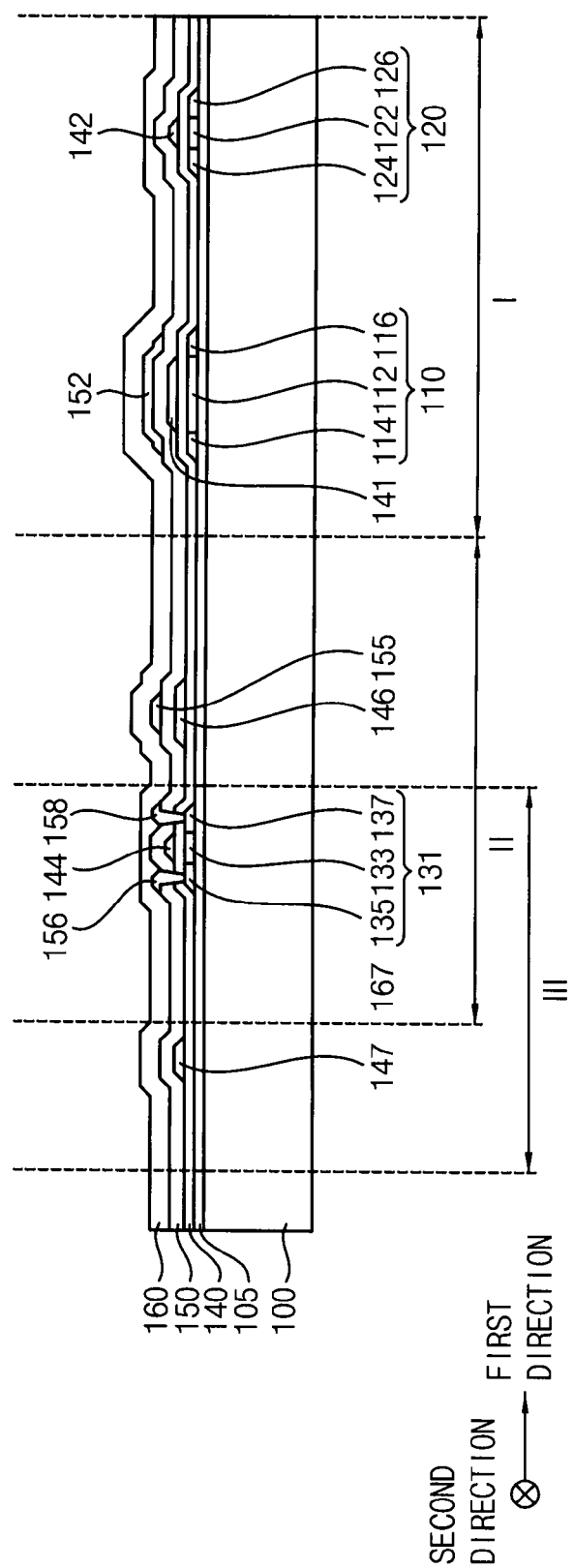

Referring to FIG. 17, a second conductive pattern 152, a third conductive pattern 155, a second source electrode 156 and a second drain electrode 158 may be formed on the first insulating interlayer 150, and then a second insulating interlayer 160 may be formed on the first insulating interlayer 150.

The first insulating interlayer 150 and the gate insulation layer 140 may be partially removed to form openings exposing the third source region 135 and the third drain region 137, and a first conductive layer may be formed to fill the openings. The first conductive layer may be patterned to form the second conductive pattern 152, the third conductive pattern 155, the second source electrode 156 and the second drain electrode 158. The first conductive layer may include a material substantially the same as or similar to the second conductive layer of FIG. 9.

Therefore, the third active pattern 131, the third gate electrode 144, the second source electrode 156 and the second drain electrode 158 may constitute a third transistor.

The second insulating interlayer 160 may be formed by a CVD process using, for example, silicon oxide or silicon nitride. The second insulating interlayer 160 may cover the second conductive pattern 152, the third conductive pattern 155, the second source electrode 156 and the second drain electrode 158.

Figure 18:
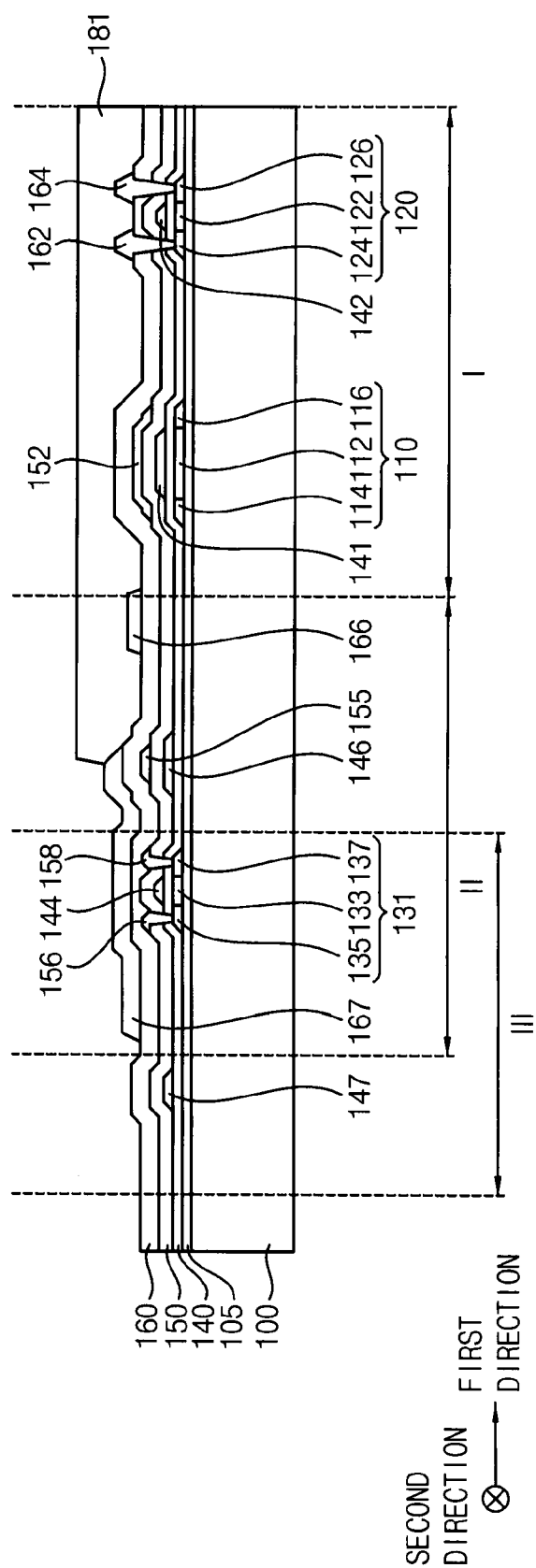

Referring to FIG. 18, a first source electrode 162, a first drain electrode 164, a fourth conductive pattern 166 and a first wiring pattern 167 may be formed on the second insulating interlayer 160, and then an insulation layer 181 may be formed.

A second conductive layer may be formed on the second insulating interlayer 160, and then the second conductive layer may be patterned to form the first source electrode 162, the first drain electrode 164, the fourth conductive pattern 166 and the first wiring pattern 167. The second conductive layer may include a material substantially the same as or similar to that of the third conductive layer of FIG. 10.

Therefore, the first source electrode 162 and the first drain electrode 164, the second active pattern 120 and the second gate electrode 142 may constitute a second thin film transistor. Further, a source electrode (now shown), a drain electrode (not shown), a first gate electrode 141 and the first active pattern 110 may constitute a first thin film transistor.

The fourth conductive pattern 166 may be formed in the second region (II). The fourth conductive pattern 166 may be disposed adjacent to the first region (I) compared to the third thin film transistor.

The first wiring pattern 167 may be disposed on the second insulating interlayer 160 in the second region (II) and the third region (III). The first wiring pattern 167 may be formed to overlap the third thin film transistor. However, the second source electrode 156 and the second drain electrode 158 may be formed under the second insulating interlayer 160, and the first wiring pattern 167 may be disposed on the second insulating interlayer 160, so that the first wiring pattern 167 may be electrically isolated from the third thin film transistor.

On the other hand, the insulation layer 181 may be disposed in the first region (I) and the second region (II). However, the insulation layer 181 may not be disposed in the third region (III). The insulation layer 181 may include an insulation organic material such as, for example, polyimide.

Figure 19:
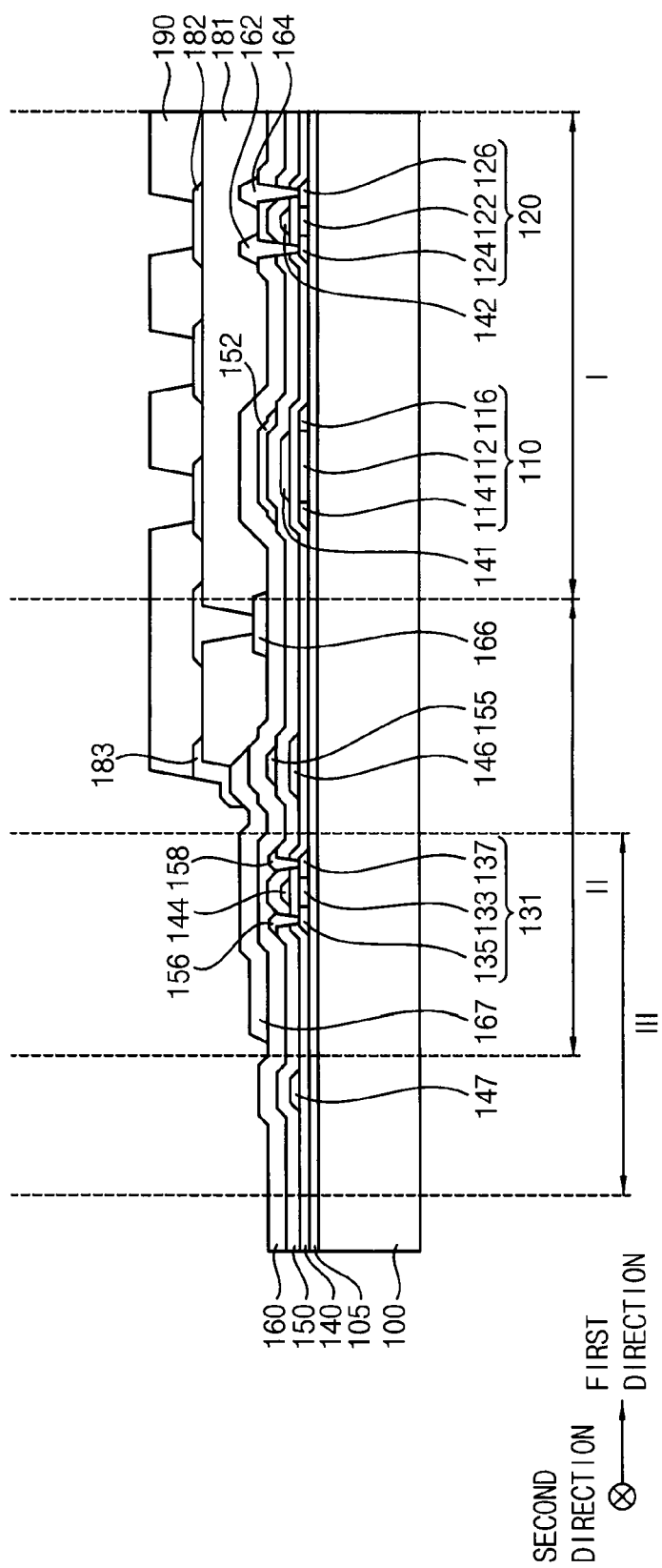

Referring to FIG. 19, a first electrode 182 and a fifth conductive pattern 183 may be formed on the insulation layer 181, and a pixel defining layer 190 may be formed on the insulation layer 181.

Processes for forming the first electrode 182, the fifth conductive pattern 183 and the pixel defining layer 190 may be substantially the same as or similar to those described with reference to FIG. 11. The fifth conductive pattern 183 may be electrically connected to the first wiring pattern 167 through a sidewall of the insulation layer 181. Further, the fifth conductive pattern 183 may be formed in the second region (II), not in the third region (III).

Figure 20:
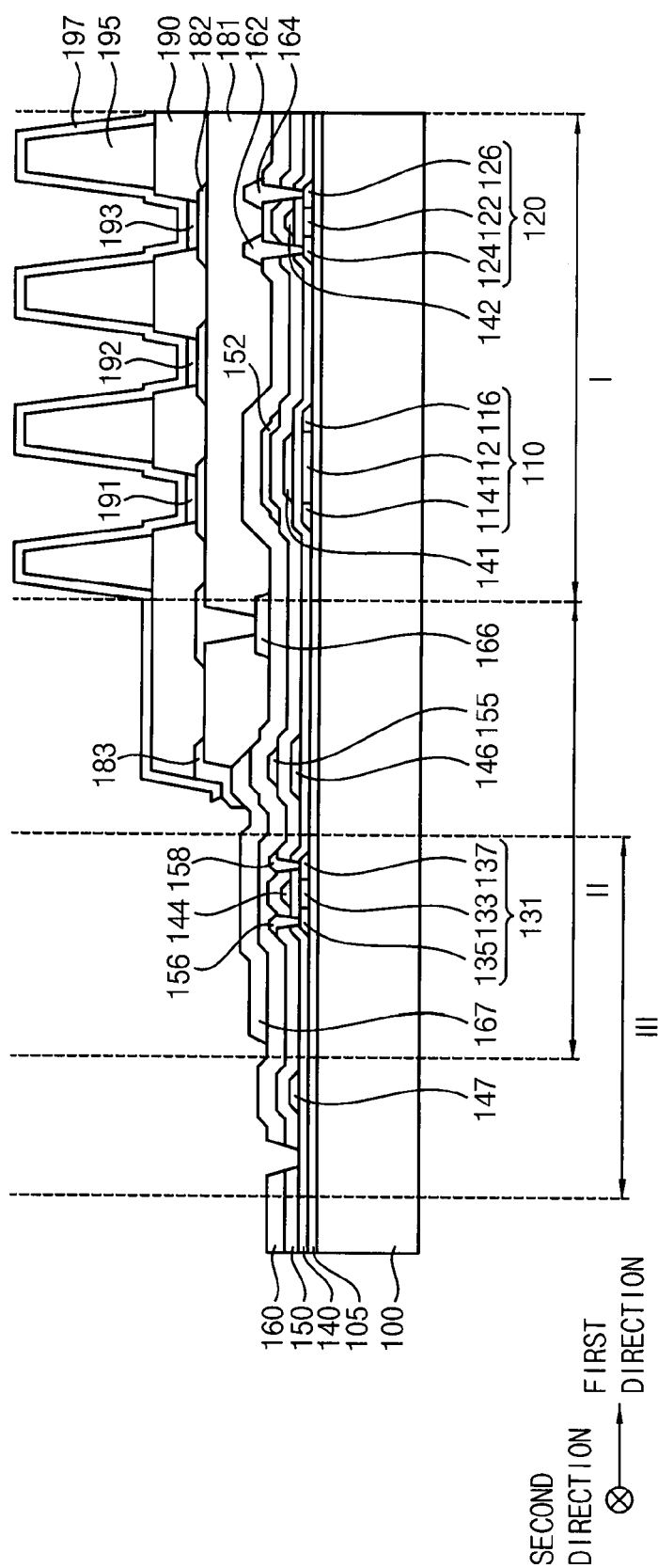

Referring to FIG. 20, organic light emitting structures 191, 192 and 193 may be formed on the first electrode 182, a spacer 195 may be formed on the pixel defining layer 190, and then a second electrode 197 may be formed to cover the spacer 195.

Therefore, the second electrode 197 may be electrically connected to the first wiring pattern 167 through the fifth conductive pattern 183. In example embodiments, the second electrode 197 may be formed in the first region (I) and the second region (II), and may not be formed in the third region (III). That is, the second electrode 197 may directly contact the fifth conductive pattern 183 in the second region (II).

Figure 21:
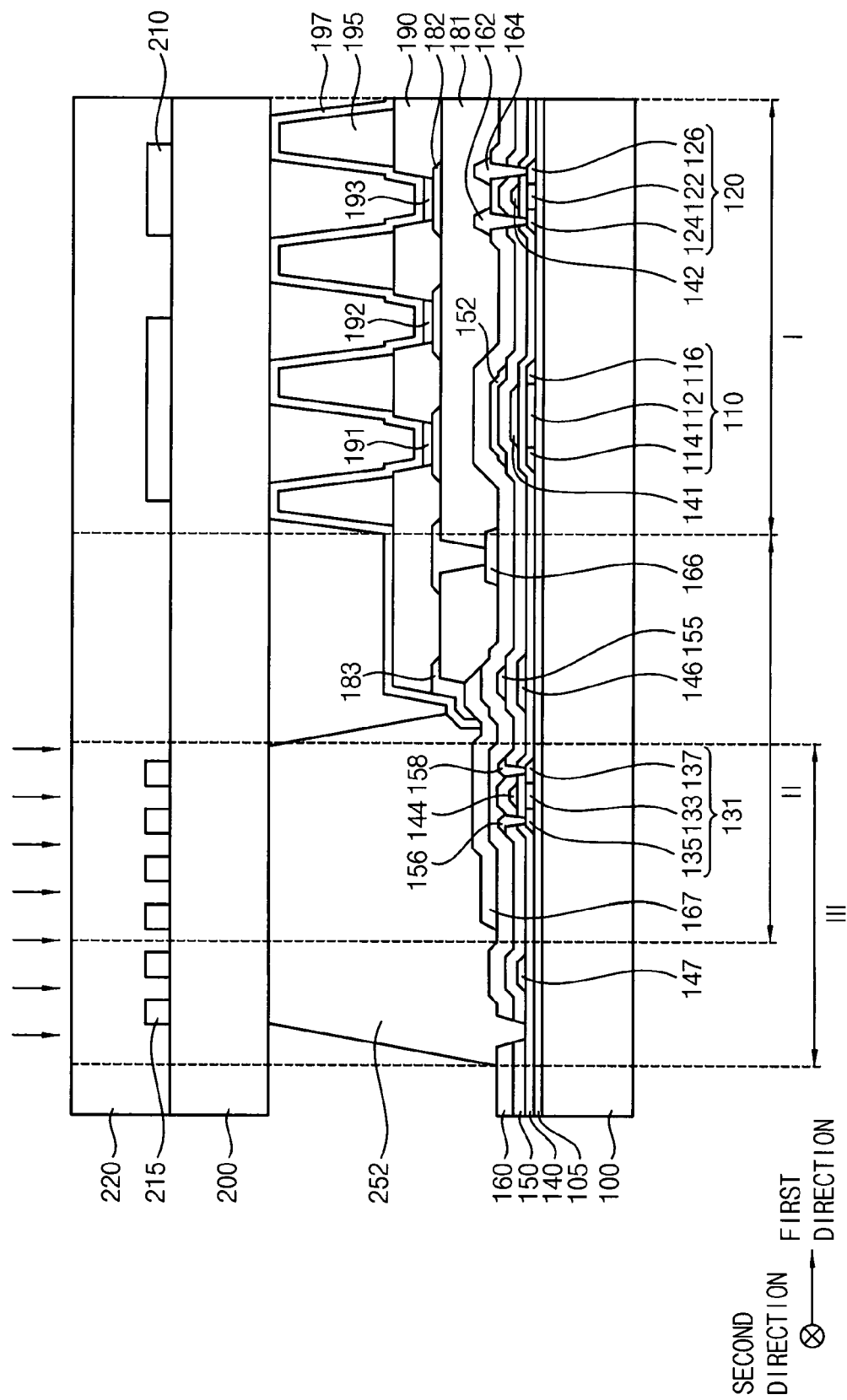

Referring to FIG. 21, a touch panel may be formed on a second substrate 200, the first substrate 100 and the second substrate 200 may be arranged to face each other, and a seal 250 may be disposed between the first substrate 100 and the second substrate 200 in the third region (III). Then, a laser beam may be irradiated in the third region (III), so that the organic light emitting display apparatus may be encapsulated.

A plurality of sensing cells 210, a plurality of second wiring patterns 215 and a protection layer 220 may be formed on the second substrate 200. The seal 250 may be melted by the laser beam, so that the seal 250 may be deformed to complete a gap between the first substrate 100 and the second substrate 200.

According to example embodiments, the insulation layer 181 including the insulation organic material may not be disposed in the third region (III). Therefore, the insulation layer 181 may not be deformed due to the laser beam used for heating the seal. Further, the fifth conductive pattern 183 and the second electrode 197 may not be disposed in the third region (III), the fifth conductive pattern 183 and the second electrode 197 may not be damaged by the laser beam. The first wiring pattern 167 overlapping the third thin film transistor may prevent a thermal damage of the third thin film transistor from the laser beam.

The foregoing is illustrative of example embodiments, and is not to be construed as limiting thereof. Although certain embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. An organic light emitting display apparatus comprising:
    a first substrate including a first region, a second region and a third region, wherein the third region surrounds the first region, and the second region is between the first region and the third region and is partially overlapped with the third region;
    a second substrate facing the first substrate;
    an organic light emitting device on the first substrate in the first region;
    a thin film transistor on the first substrate in a region where the second region and the third region overlap;
    a wiring pattern on the first substrate in the second region; and
    a seal in the third region, disposed between the first substrate and the second substrate, wherein the seal overlaps the thin film transistor.

2. The organic light emitting display apparatus of claim 1, wherein the organic light emitting device includes a first electrode, an organic light emitting structure and a second electrode.

3. The organic light emitting display apparatus of claim 2, wherein the second electrode is disposed in the second region and the first region, and wherein the second electrode is exposed by the seal.

4. The organic light emitting display apparatus of claim 2, further comprising a conductive pattern disposed in the second region,
    wherein the conductive pattern electrically connects the wiring pattern and the second electrode, and the conductive pattern includes a same material as the first electrode.

5. The organic light emitting display apparatus of claim 4, wherein the conductive pattern is exposed by the seal.

6. The organic light emitting display apparatus of claim 2, wherein the second electrode includes an alloy of magnesium (Mg) and silver (Ag).

7. The organic light emitting display apparatus of claim 2, wherein the first electrode has a multi layered structure including an indium tin oxide (ITO)/Ag/ITO stack.

8. The organic light emitting display apparatus of claim 1, wherein the wiring pattern is disposed adjacent to the first region.

9. The organic light emitting display apparatus of claim 1, wherein the wiring pattern has a multi layered structure including a Ti/Al/Ti stack.

10. The organic light emitting display apparatus of claim 1, wherein the wiring pattern is exposed by the seal.

11. The organic light emitting display apparatus of claim 1, wherein the wiring pattern is configured to transfer a power supply voltage.

12. The organic light emitting display apparatus of claim 1, further comprising a second wiring pattern electrically connected to the wiring pattern,
wherein the second wiring pattern includes a same material as a gate electrode of the thin film transistor.

13. The organic light emitting display apparatus of claim 1, further comprising an insulating interlayer covering the wiring pattern,
wherein the insulating interlayer is configured to protect the wiring pattern from heat damage.

14. An organic light emitting display apparatus comprising:
a first substrate including a first region, a second region and a third region, wherein the third region surrounds the first region, and the second region is between the first region and the third region and is partially overlapped with the third region;
a second substrate opposed to the first substrate;
a first thin film transistor on the first substrate in the first region;
an organic light emitting device on the first substrate in the first region, the organic light emitting device being electrically connected to the first thin film transistor;
a second thin film transistor on the first substrate in a region where the second region and the third region overlap;
an insulation layer covering the first thin film transistor, the insulation layer including an organic insulation material;
a wiring pattern on the first substrate in the second region, the wiring pattern overlapping the second thin film transistor; and
a seal between the first substrate and the second substrate in the third region, wherein the seal overlaps the second thin film transistor.

15. The organic light emitting display apparatus of claim 14, wherein the insulation layer is disposed on the first substrate in the first region and the second region, and the insulation layer is exposed by the seal.

16. The organic light emitting display apparatus of claim 14, further comprising an insulating interlayer between the insulation layer and the first substrate,
wherein the insulating interlayer covers the second thin film transistor, and the wiring pattern is disposed on the insulating interlayer.

17. A method of manufacturing an organic light emitting display apparatus, the method comprising:
preparing a first substrate including a first region, a second region and a third region, wherein the third region surrounds the first region, and the second region is between the first region and the third region and is partially overlapped with the third region;
forming a first thin film transistor on the first substrate in the first region;
forming a second thin film transistor on the first substrate in a region where the second region and the third region overlap;
forming an organic light emitting device on the first substrate in the first region;
arranging a second substrate to face the first substrate;
forming a seal between the first substrate and the second substrate in the third region, wherein the seal overlaps the second thin film transistor; and
irradiating a laser beam to melt the seal.

18. The method of claim 17, wherein forming the organic light emitting device includes:
forming a first electrode electrically connected to the first thin film transistor;
forming an organic light emitting structure on the first substrate; and
forming a second electrode on the organic light emitting structure,
wherein the second electrode is exposed by the seal.

19. The method of claim 18, further comprising a wiring pattern in the second region after forming the first thin film transistor and the second thin film transistor.

20. The method of claim 19, further comprising forming a conductive pattern in the second region,
wherein the conductive pattern is electrically connected to the wiring pattern, and wherein forming the conductive pattern and forming the first electrode are performed simultaneously.

21. The method of claim 20, wherein the conductive pattern is electrically connected to the second electrode, and the conductive pattern is exposed by the seal.

* * * * *